(12) United States Patent
Chen et al.

(10) Patent No.: US 12,514,039 B2
(45) Date of Patent: Dec. 30, 2025

(54) DISPLAY PANEL AND DISPLAY APPARATUS

(71) Applicant: Shanghai Tianma Micro-Electronics Co., Ltd., Shanghai (CN)

(72) Inventors: Liqun Chen, Shanghai (CN); Xiaoli Liu, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 390 days.

(21) Appl. No.: 18/347,243

(22) Filed: Jul. 5, 2023

(65) Prior Publication Data
US 2023/0352638 A1 Nov. 2, 2023

(30) Foreign Application Priority Data
Apr. 14, 2023 (CN) .......................... 202310404941.0

(51) Int. Cl.
| | |
|---|---|
| *H01L 33/54* | (2010.01) |
| *H01L 25/075* | (2006.01) |
| *H10H 20/853* | (2025.01) |
| *H10H 20/856* | (2025.01) |

(52) U.S. Cl.
CPC ....... *H10H 20/853* (2025.01); *H01L 25/0753* (2013.01); *H10H 20/856* (2025.01)

(58) Field of Classification Search
CPC .. H10H 20/853; H10H 20/856; H10H 20/855; H10H 29/142; H01L 25/0753
See application file for complete search history.

(56) References Cited

U.S. PATENT DOCUMENTS

| | | | |
|---|---|---|---|
| 2019/0097094 A1* | 3/2019 | Han | H10H 20/8512 |
| 2021/0226106 A1* | 7/2021 | Yun | H10H 20/84 |
| 2024/0145645 A1* | 5/2024 | Li | H01L 25/0753 |

* cited by examiner

*Primary Examiner* — Elmito Breval
(74) *Attorney, Agent, or Firm* — CHRISTENSEN O'CONNOR JOHNSON KINDNESS PLLC

(57) ABSTRACT

A display panel includes a substrate, a plurality of light-emitting devices, a first encapsulation layer, and a first dielectric layer. The first encapsulation layer includes a first portion and a second portion at least partially surrounding the first portion. The first dielectric layer is located between the first encapsulation layer and the plurality of light-emitting devices. Along the direction perpendicular to the plane of the display panel, a distance between a surface of the first portion away from at least one light-emitting device of the plurality of light emitting devices and a surface of the third portion away from the at least one light-emitting device is smaller than a distance between a surface of the second portion away from the at least one light-emitting device and a surface of the fourth portion away from the at least one light-emitting device.

20 Claims, 30 Drawing Sheets

DISPLAY PANEL AND DISPLAY APPARATUS

CROSS-REFERENCE TO RELATED APPLICATION

The present application claims priority to Chinese Patent Application No. 202310404941.0, filed on Apr. 14, 2023, the content of which is incorporated herein by reference in its entirety.

TECHNICAL FIELD

The present disclosure relates to the field of display technologies, and, particularly, relates to a display panel and a display apparatus.

BACKGROUND

Display devices such as a micro-light emitting diode (micro-LED) and a mini-LED are gradually emerging as a research hotspot in the display field. However, light shapes of exiting light from the display devices are diverged. There is a butterfly light shape that is dark at a front viewing angle and bright at a side viewing angle. In addition, an encapsulation layer with a larger refractive index is provided at one side of a light exit surface of the display device. This causes a low light exit efficiency of the display device.

The divergence for the light shape of the display device is ascribed to an inherent structure of the existing LED. On the other hand, when light emitted by the LED enter air through the encapsulation layer, while a light exit angle increases, a light intensity under a large viewing angle increases, and a light intensity under a front viewing angle is reduced. The low light exit efficiency of the display device lies in: The encapsulation layer has the larger refractive index than air. Large-angle light emitted by the LED is totally reflected at an interface between the encapsulation layer and the air, and cannot be utilized.

SUMMARY

A first aspect of the present disclosure provides a display panel. The display panel includes a substrate; light-emitting devices located on the substrate; a first encapsulation layer located at a side of the light-emitting devices facing a light exit surface of the display panel, and a first dielectric layer located between the first encapsulation layer and one of the light-emitting devices. The first encapsulation layer includes a first portion and a second portion at least partially surrounding the first portion. Along a direction perpendicular to a plane of the display panel, the first portion at least partially overlaps with the light-emitting device. The first dielectric layer is located between the first encapsulation layer and one of the light-emitting devices. The first dielectric layer includes a third portion and a fourth portion at least partially surrounding the third portion; and along the direction perpendicular to the plane of the display panel, the third portion at least partially overlaps with the light-emitting device. A refractive index of the first dielectric layer is smaller than a refractive index of the first encapsulation layer; and along the direction perpendicular to the plane of the display panel, a distance between a surface of the first portion away from the light-emitting device and a surface of the third portion away from the light-emitting device is defined as H1a, and a distance between a surface of the second portion away from the light-emitting device and a surface of the fourth portion away from the light-emitting device is defined as H1b, wherein H1a<H1b.

A second aspect of the present disclosure provides a display apparatus. The display apparatus includes a display panel. The display panel includes a substrate; light-emitting devices located on the substrate; a first encapsulation layer located at a side of the light-emitting devices facing a light exit surface of the display panel, and a first dielectric layer located between the first encapsulation layer and one of the light-emitting devices. The first encapsulation layer includes a first portion and a second portion at least partially surrounding the first portion. Along a direction perpendicular to a plane of the display panel, the first portion at least partially overlaps with the light-emitting device. The first dielectric layer is located between the first encapsulation layer and one of the light-emitting devices. The first dielectric layer includes a third portion and a fourth portion at least partially surrounding the third portion; and along the direction perpendicular to the plane of the display panel, the third portion at least partially overlaps with the light-emitting device. A refractive index of the first dielectric layer is smaller than a refractive index of the first encapsulation layer; and along the direction perpendicular to the plane of the display panel, a distance between a surface of the first portion away from the light-emitting device and a surface of the third portion away from the light-emitting device is defined as H1a, and a distance between a surface of the second portion away from the light-emitting device and a surface of the fourth portion away from the light-emitting device is defined as H1b, wherein H1a<H1b.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

In the description of this specification, it should be understood that the terms such as "basically", "approximate to", "approximately", "about", "roughly", and "substantially" described in the claims and embodiments of the present disclosure mean general agreement within a reasonable process operation range or tolerance range, rather than an exact value.

It should be understood that although the terms 'first', 'second' and 'third' may be used in the present disclosure to describe sides, these sides should not be limited to these terms. These terms are used only to distinguish the regions from each other. For example, without departing from the scope of the embodiments of the present disclosure, a first region may also be referred to as a second region. Similarly, the second region may also be referred to as the first region.

Figure 1:
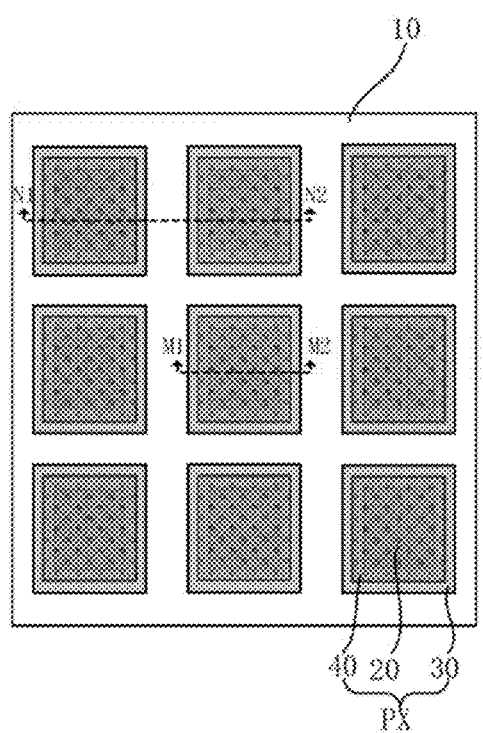
FIG. 1 is a schematic view of a display panel according to some embodiments of the present disclosure.
Figure 2:
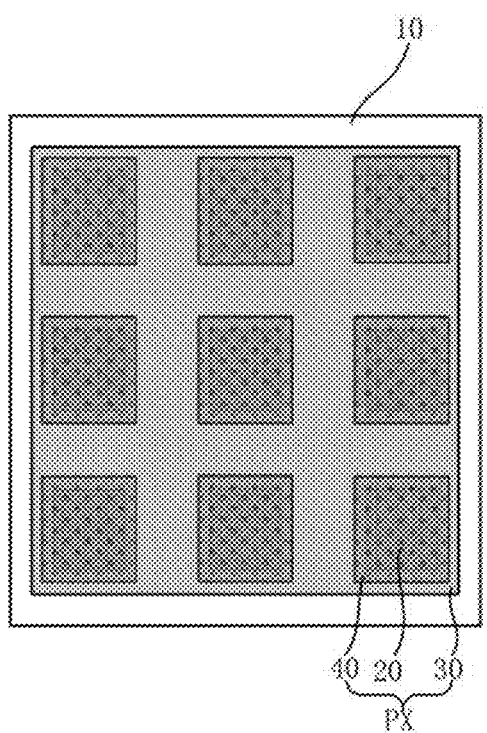
FIG. 2 is a schematic view of a display panel according to some embodiments of the present disclosure.
Figure 3:
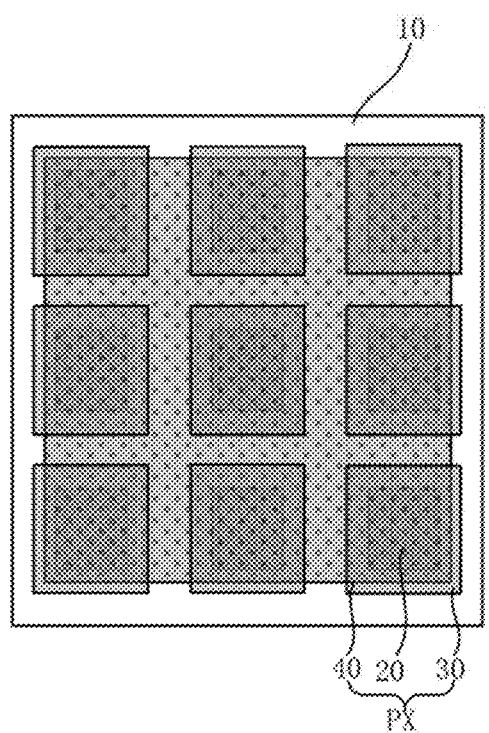
FIG. 3 is a schematic view of a display panel according to some embodiments of the present disclosure.

FIG. 1 is a schematic view of a display panel according to some embodiments of the present disclosure. FIG. 2 is a schematic view of a display panel according to some embodiments of the present disclosure. FIG. 3 is a schematic view of a display panel according to some embodiments of the present disclosure.

As shown in FIG. 1 to FIG. 3, a display panel includes a substrate 10 and multiple sub-pixels PX on the substrate. The sub-pixel PX includes a light-emitting device 20. In addition, the sub-pixel PX further includes a first encapsulation layer 30 and a first dielectric layer 40. It is to be noted that FIG. 1 takes a case where first encapsulation layers 30 and first dielectric layers 40 of adjacent sub-pixels PX are provided independently as an example to schematically describe the technical solution. However, there are no limits made on the solution of the present disclosure. The first encapsulation layers 30 of the adjacent sub-pixels PX may be connected as shown in FIG. 2, and may also be provided independently as shown in FIG. 1 and FIG. 3. The first dielectric layers 40 of the adjacent sub-pixels PX may be connected as shown in FIG. 3, and may also be provided independently as shown in FIG. 1 and FIG. 2.

Figure 4:
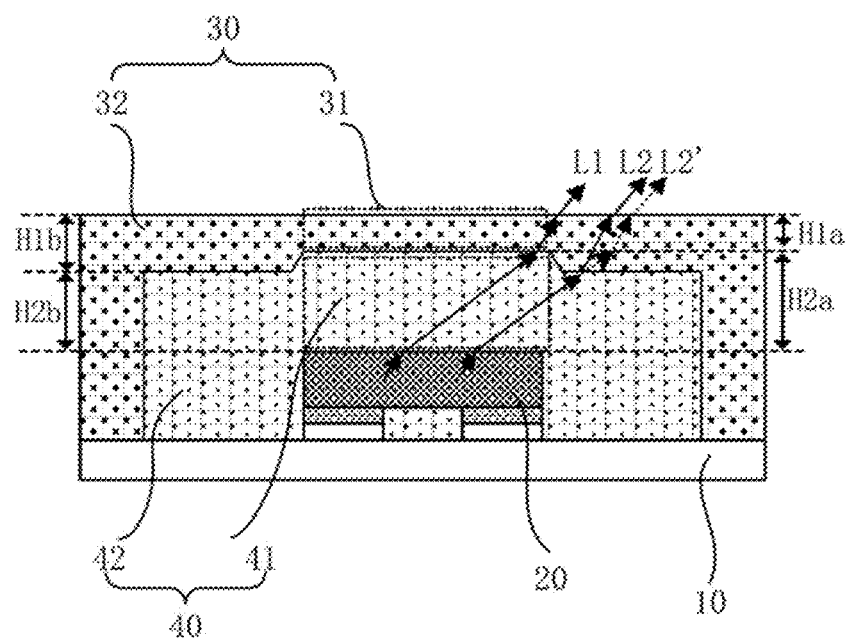
FIG. 4 is a schematic cross-sectional view along a direction M1-M2 shown in FIG. 1 according to some embodiments of the present disclosure.
Figure 5:
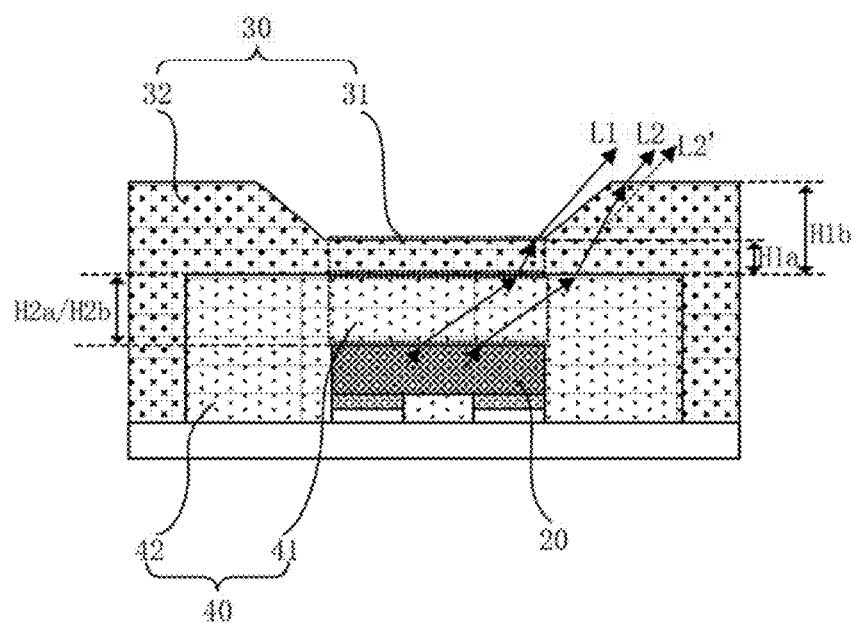
FIG. 5 is a schematic cross-sectional view along a direction M1-M2 shown in FIG. 1 according to some embodiments of the present disclosure.

FIG. 4 is a schematic cross-sectional view along a direction M1-M2 shown in FIG. 1 according to some embodiments of the present disclosure. FIG. 5 is a schematic cross-sectional view along a direction M1-M2 shown in FIG. 1 according to some embodiments of the present disclosure.

As shown in FIG. 4 and FIG. 5, a display panel provided by the embodiments of the present disclosure includes a substrate 10, multiple light-emitting devices 20, a first encapsulation layer 30, and a first dielectric layer 40. The light-emitting devices 20, the first encapsulation layer 30 and the first dielectric layer 40 are provided at a same side of the substrate 10.

The first encapsulation layer 30 is located at a side of the light-emitting device 20 facing a light exit surface of the display panel. The first encapsulation layer 30 is configured to encapsulate and protect the light-emitting device 20. The first dielectric layer 40 is located between the first encapsulation layer 30 and the light-emitting device 20. The first dielectric layer 40 is provided at the side of the light-emitting device 20 facing the light exit surface of the display panel 10. Along a direction perpendicular to a plane of the display panel, both the first encapsulation layer 30 and the first dielectric layer 40 cover the light-emitting device 20. A refractive index of the first dielectric layer 40 is smaller than a refractive index of the first encapsulation layer 30.

The light-emitting device 20 may be at least one of a micro-LED and a mini-LED.

Referring to FIG. 4 and FIG. 5, the first encapsulation layer 30 includes a first portion 31 and a second portion 32. The second portion 32 at least partially surrounds the first portion 31, i.e., the second portion 32 is located at a periphery of the first portion 31. Along the direction perpendicular to the plane of the display panel, the first portion 31 at least partially overlaps with the light-emitting device 20.

Referring also to FIG. 4 and FIG. 5, the first dielectric layer 40 includes a third portion 41 and a fourth portion 42. The fourth portion 42 at least partially surrounds the third portion 41, i.e., the fourth portion 42 is located at a periphery of the third portion 41. Along the direction perpendicular to the plane of the display panel, the third portion 41 at least partially overlaps with the light-emitting device 20.

In some embodiments of the present disclosure, along the direction perpendicular to the plane of the display panel, the first portion 31 at least partially overlaps with the third portion 41, and the second portion 32 at least partially overlaps with the fourth portion 42.

As shown in FIG. 4 and FIG. 5, along the direction perpendicular to the plane of the display panel, a distance between a surface of the first portion 31 of the first encapsulation layer 30 away from the light-emitting device 20 and a surface of the third portion 41 of the first dielectric layer 40 away from the light-emitting device 20 is defined as H1a. Along the direction perpendicular to the plane of the display panel, the surface of the first portion 31 away from the light-emitting device 20 is the surface of the first portion 31 facing the light exit surface of the display panel, and the surface of the third portion 41 away from the light-emitting device 20 is the surface of the third portion 41 facing the light exit surface of the display panel.

As shown in FIG. 4 and FIG. 5, along the direction perpendicular to the plane of the display panel, a distance between a surface of the second portion 32 of the first encapsulation layer 30 away from the light-emitting device 20 and a surface of the fourth portion 42 of the first dielectric layer 40 away from the light-emitting device 20 is defined as H1b. Along the direction perpendicular to the plane of the display panel, the surface of the third portion 32 away from the light-emitting device 20 is the surface of the second portion 32 facing the light exit surface of the display panel, and the surface of the fourth portion 42 away from the light-emitting device 20 is the surface of the fourth portion facing the light exit surface of the display panel.

In some embodiments of the present disclosure, H1a<H1b, that is, along the direction perpendicular to the plane of the display panel, the distance between the surface of the first portion 31 facing the light exit surface of the display panel and the surface of the third portion 41 facing the light exit surface of the display panel is smaller than the distance between the surface of the second portion 32 facing the light exit surface of the display panel and the surface of the fourth portion 42 facing the light exit surface of the display panel. In other words, along the direction perpendicular to the plane of the display panel, a distance between an upper surface of the first portion 31 and an upper surface of the overlapping third portion 41 is smaller than a distance between an upper surface of the second portion 41 and an upper surface of the overlapping fourth portion 42.

According to the display panel provided by the embodiments of the present disclosure, because of different refractive indexes and different structures of the first encapsulation layer 30 and the first dielectric layer 40 at the side of the light-emitting device 20 facing the light exit surface of the display panel, a light effect can be effectively improved, and light shapes when light emitted by the light-emitting device 20 exits from the light exit surface of the display panel can be improved.

The first encapsulation layer 30 has a higher refractive index than a dielectric (such as air) thereon. Large-angle light emitted by the light-emitting device 20 has a great probability of directly exiting from the first encapsulation layer 30 and being reflected totally. In some embodiments of the present disclosure, light L1 is taken as an example for description. Referring to FIG. 4 and FIG. 5, since the refractive index of the first dielectric layer 40 is smaller than the refractive index of the first encapsulation layer 30, when the large-angle light L1 emitted by the light-emitting device 20 enters the first encapsulation layer 30 from the first dielectric layer 40, an angle between the large-angle light L1 and a normal direction of the display panel in the first encapsulation layer 30 is decreased. When the large-angle light L1 exits from the first encapsulation layer 30, an amount of light with an angle greater than a total reflection critical angle is reduced, thereby improving the light exit efficiency of the display panel.

A same light beam emitted by the light-emitting device 20 is taken as an example for description. It is assumed that light L2' in FIG. 4 and FIG. 5 is emitted by the light-emitting device 20 and belong to the same light beam with light L2. The light L2' is not real light.

As shown in FIG. 4, for the same light beam emitted by the light-emitting device 20, after light enters the fourth portion 42 of the first dielectric layer 40, if the upper surface of the fourth portion 42 is flush with the upper surface of the third portion 41, the light L2' enters the first encapsulation layer 30 from a position flush with the upper surface of the third portion 41 in the first dielectric layer 40. In fact, the upper surface of the fourth portion 42 is lower than the upper surface of the third portion 41, the light L2 enters the first encapsulation layer 30 from the upper surface of the fourth portion 42. When the light L2 and the light L2' exit from the first encapsulation layer 30, the light L2 is closer to the light exit surface above the light-emitting device 20 than the light L2'.

As shown in FIG. 5, for the same light beam emitted by the light-emitting device 20, after light enters the first dielectric layer 40 and enters the first encapsulation layer 30 from the first dielectric layer 40, if the upper surface of the second portion 32 is flush with the upper surface of the first portion 31, the light L2' exits from a position flush with the upper surface of the first portion 31 in the first encapsulation layer 30. In fact, the upper surface of the second portion 32 is higher than the upper surface of the first portion 31, the light L2 exits from the upper surface of the second portion 32. The light L2 is closer to the light exit surface above the light-emitting device 20 than the light L2'.

Therefore, for the light emitted by the light-emitting device 20, light emitted from a light exit surface at a periphery of a region of the light-emitting device 20 is more likely to exit near the light exit surface above the light-emitting device 20, in case of a longer transmission path in the first encapsulation layer 30 in the direction perpendicular to the plane of the display panel. Therefore, in the embodiments of the present disclosure, the H1b is greater than the H1a, so that the first encapsulation layer 30 at least located at the periphery of the region of the light-emitting device 20 is thicker. The light incident to the second portion 32 has a longer transmission path in the first encapsulation layer 30 in the direction perpendicular to the plane of the display panel. An amount of light exiting from the light exit surface above the light-emitting device 20 or exiting near the light exit surface above the light-emitting device 20 increases. This improves the light shapes when the light emitted by the light-emitting device 20 exits from the light exit surface of the display panel.

In addition, the H1b is smaller than the H1a in some embodiments of the present disclosure, the first encapsulation layer 30 located in the region of the light-emitting device 20 is thinner, and the first portion 31 of the first encapsulation layer 30 has a higher light transmittance. Therefore, the light emitted by the light-emitting device 20 enters the first portion 31 of the first encapsulation layer 30, and an amount of light exiting from the light exit surface above the light-emitting device 20 or exiting near the light exit surface above the light-emitting device 20 increases. This improves the light shapes when the light emitted by the light-emitting device 20 exits from the light exit surface of the display panel.

In some embodiments of the present disclosure, as shown in FIG. 4, along the direction perpendicular to the plane of the display panel, a distance between the surface of the third portion 41 away from the light-emitting device 20 and the light-emitting device 20 is defined as H2a, and a distance between the surface of the fourth portion 42 away from the light-emitting device 20 and the light-emitting device 20 is defined as H2b, H2a>H2b. In other words, along the direction perpendicular to the plane of the display panel, a distance between the surface of the fourth portion 42 of the first dielectric layer 40 facing the light exit surface of the display panel 10 and the light-emitting device 20 is smaller than a distance between the surface of the third portion 41 of the first dielectric layer 40 facing the light exit surface of the display panel 10 and the light-emitting device 20. The fourth portion 42 of the first dielectric layer 40 recesses relative to the third portion 41 toward a direction away from the first encapsulation layer 30, or, the third portion 41 of the first dielectric layer 40 protrudes relative to the fourth portion 42 toward a direction facing the first encapsulation layer 30.

By recessing or protruding the surface of the first dielectric layer 40 facing the light exit surface of the display panel, the H1a is smaller than the H1b.

In some embodiments of the present disclosure, a surface of the first encapsulation layer 30 facing the light-emitting device 20 may be a plane structure. In some embodiments of the present disclosure, the surface of the first encapsulation layer 30 facing the light-emitting device 20 is parallel to the substrate 10.

In some embodiments of the present disclosure, as shown in FIG. 5, along the direction perpendicular to the plane of the display panel, a distance between the surface of the first portion 31 away from the light-emitting device 20 and the light-emitting device 20 is defined as Ha, and a distance between the surface of the second portion 31 away from the light-emitting device 20 and the light-emitting device 20 is defined as Hb, Ha<Hb. In other words, along the direction perpendicular to the plane of the display panel 10, a distance between the surface of the first portion 31 of the first encapsulation layer 30 facing the light exit surface of the display panel 10 and the light-emitting device 20 is smaller than a distance between the surface of the second portion 31 of the first encapsulation layer 30 facing the light exit surface of the display panel 10 and the light-emitting device 20. The first portion 31 of the first encapsulation layer 30 recesses relative to the second portion 32 toward a direction facing the first dielectric layer 40, or, the second portion 32 of the first encapsulation layer 30 protrudes relative to the first portion 31 toward a direction away from the first dielectric layer 40.

By recessing or protruding the surface of the first encapsulation layer 30 facing the light exit surface of the display panel, the H1a is smaller than the H1b.

In some embodiments of the present disclosure, a surface of the first dielectric layer 40 facing the light-emitting device 20 may be a plane structure. In some embodiments of the present disclosure, the surface of the first dielectric layer 40 facing the light-emitting device 20 is parallel to the substrate 10.

Figure 6:
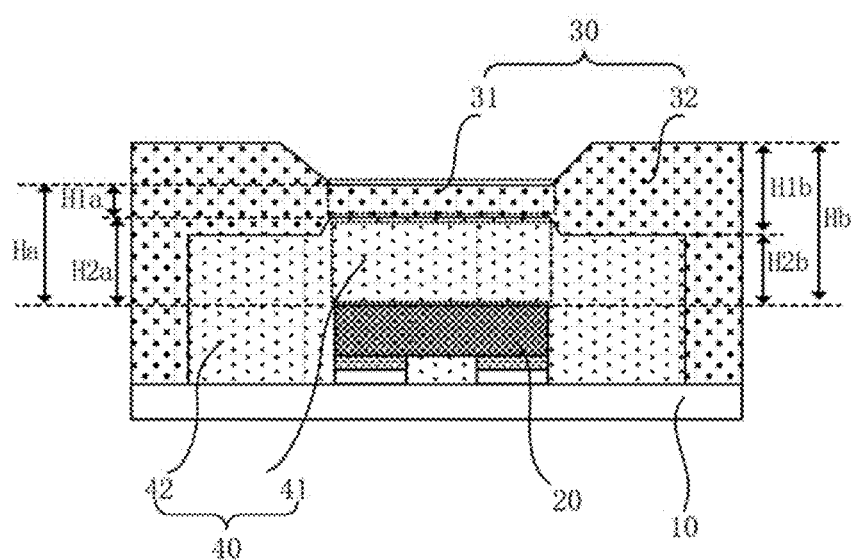
FIG. 6 is a schematic cross-sectional view along a direction M1-M2 shown in FIG. 1 according to some embodiments of the present disclosure.

FIG. 6 is a schematic cross-sectional view along a direction M1-M2 shown in FIG. 1 according to some embodiments of the present disclosure.

In some embodiments of the present disclosure, as shown in FIG. 6, along the direction perpendicular to the plane of the display panel, a distance between the surface of the third portion 41 away from the light-emitting device 20 and the light-emitting device 20 is defined as H2a, a distance between the surface of the fourth portion 42 away from the light-emitting device 20 and the light-emitting device 20 is defined as H2b, a distance between the surface of the first portion 31 away from the light-emitting device 20 and the light-emitting device 20 is defined as Ha, and a distance between the surface of the second portion 31 away from the light-emitting device 20 and the light-emitting device 20 is defined as Hb, where H2a>H2b and Ha<Hb. In other words, along the direction perpendicular to the plane of the display panel 10, a distance between the surface of the fourth portion 42 of the first dielectric layer 40 facing the light exit surface of the display panel 10 and the light-emitting device 20 is smaller than a distance between the surface of the third portion 41 of the first dielectric layer 40 facing the light exit surface of the display panel 10 and the light-emitting device 20, and a distance between the surface of the first portion 31 of the first encapsulation layer 30 facing the light exit surface of the display panel 10 and the light-emitting device 20 is smaller than a distance between the surface of the second portion 31 of the first encapsulation layer 30 facing the light exit surface of the display panel 10 and the light-emitting device 20. That is, the third portion 41 of the first dielectric layer 40 protrudes relative to the fourth portion 42 toward a direction facing the first encapsulation layer 30, and the first portion 31 of the first encapsulation layer 30 recesses relative to the second portion 32 toward the direction facing the first dielectric layer 40, or, the fourth portion 42 of the first dielectric layer 40 recesses relative to the third portion 41 toward a direction away from the first encapsulation layer 30, and the second portion 32 of the first encapsulation layer 30 protrudes relative to the first portion 31 toward a direction away from the first dielectric layer 40.

By recessing or protruding the surface of the first dielectric layer 40 facing the light exit surface of the display panel and the surface of the first encapsulation layer 30 facing the light exit surface of the display panel, the H1a is smaller than the H1b.

In some embodiments of the present disclosure, as shown in FIG. 4 and FIG. 6, the surface of the first dielectric layer 40 facing the light exit surface of the display panel is a step structure. That is, a stepwise differentiated design is provided for the distance between the surface of the first dielectric layer 40 facing the light exit surface of the display panel and the light-emitting device 20 along the direction perpendicular to the plane of the display panel.

In some embodiments of the present disclosure, as shown in FIG. 4 and FIG. 6, when the distance H2a between the surface of the third portion 41 away from the light-emitting device 20 and the light-emitting device 20 is greater than the distance H2b between the surface of the fourth portion 42 away from the light-emitting device 20 and the light-emitting device 20 along the direction perpendicular to the plane of the display panel, the third portion 41 and the fourth portion 42 of the first dielectric layer 40 can form the step structure.

With the above analysis, for a purpose of realizing that the H1a is smaller than the H1b, a differentiated design is provided for the distance between the surface of the first encapsulation layer 30 facing the light exit surface of the display panel and the light-emitting device 20 along the direction perpendicular to the plane of the display panel, and/or, a differentiated design is provided for the distance between the surface of the first dielectric layer 40 facing the light exit surface of the display panel and the light-emitting device 20 along the direction perpendicular to the plane of the display panel. The first portion 31 and the second portion 32 can be divided according to a following rule.

When the first encapsulation layer 30 includes the first portion 31 and the second portion 32, and along the direction perpendicular to the plane of the display panel, and when a distance from the surface of the first portion 31 facing the light exit surface of the display panel to the light-emitting device 20 is different from a distance from the surface of the second portion 32 facing the light exit surface of the display panel to the light-emitting device 20, the first portion 31 overlaps with the light-emitting device 20, and the surface of the first portion 31 facing the light exit surface of the display panel is further away from the substrate 10 than the surface of the second portion 31 of the same first encapsulation layer 30 facing the light exit surface of the display panel, or, the first portion 31 overlaps with the light-emitting device 20, and the surface of the first portion 31 facing the light exit surface of the display panel is closer to the substrate 10 than the surface of the second portion 32 of the same first encapsulation layer 30 facing the light exit surface of the display panel.

In this case, if the surface of the first dielectric layer 40 facing the light exit surface of the display panel is a plane structure, a portion of the first dielectric layer 40 overlapping with the first portion 31 is the third portion 41, and a portion of the first dielectric layer 40 overlapping with the second portion 32 is the fourth portion 42.

An edge of the first portion 31 may surround the light-emitting device 20 along the direction perpendicular to the plane of the display panel, or, an edge of the light-emitting device 20 may surround the first portion 31 along the direction perpendicular to the plane of the display panel, or, as shown in FIG. 4 and FIG. 5, the edge of the light-emitting device 20 and the edge of the first portion 31 are basically aligned along the direction perpendicular to the plane of the display panel. In at least one direction parallel to the plane of the display panel, the first portion 31 is wider than the light-emitting device 20, or, the first portion 31 is narrower than the light-emitting device 20, or the first portion 31 is wider than the light-emitting device 20. In addition, a center of the first portion 31 coincides with a center of the light-emitting device 20 along the direction perpendicular to the plane of the display panel.

When the first dielectric layer 40 includes the third portion 41 and the fourth portion 42, and along the direction perpendicular to the plane of the display panel, there are different distances from the surface of the third portion 41 facing the light exit surface of the display panel and the surface of the fourth portion 42 facing the light exit surface of the display panel to the light-emitting device 20, the third portion 41 overlaps with the light-emitting device 20, and the surface of the third portion 41 facing the light exit surface of the display panel is further away from the substrate 10 than the surface of the fourth portion 42 of the same first encapsulation layer 30 facing the light exit surface of the display panel, or, the third portion 41 overlaps with the light-emitting device 20, and the surface of the third portion 41 facing the light exit surface of the display panel is closer to the substrate 10 than the surface of the fourth portion 42 of the same first encapsulation layer 30 facing the light exit surface of the display panel.

In this case, if the surface of the first encapsulation layer 30 facing the light exit surface of the display panel is the plane structure, a portion of the first encapsulation layer 30 overlapping with the third portion 41 is the first portion 31, and a portion of the first encapsulation layer 30 overlapping with the fourth portion 42 is the second portion 32.

An edge of the third portion 41 may surround the light-emitting device 20 along the direction perpendicular to the plane of the display panel, or, an edge of the light-emitting device 20 may surround the third portion 41 along the direction perpendicular to the plane of the display panel, or, as shown in FIG. 4 and FIG. 5, the edge of the light-emitting device 20 and the edge of the third portion 41 are basically aligned along the direction perpendicular to the plane of the display panel. In at least one direction parallel to the plane of the display panel, the third portion 41 is wider than the light-emitting device 20, or, the third portion 41 is narrower than the light-emitting device 20, or the third portion 41 is wider than the light-emitting device 20. In addition, a center of the third portion 41 coincides with a center of the light-emitting device 20 along the direction perpendicular to the plane of the display panel.

Figure 7:
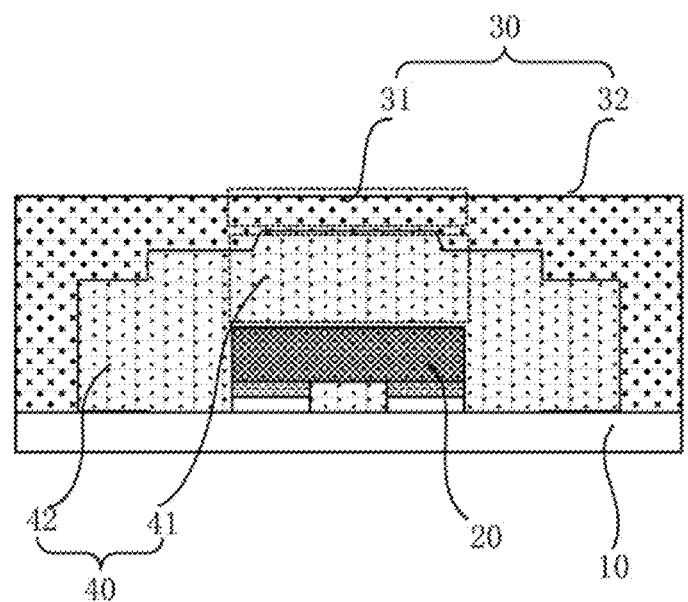
FIG. 7 is a schematic cross-sectional view along a direction M1-M2 shown in FIG. 1 according to some embodiments of the present disclosure.

FIG. 7 is a schematic cross-sectional view along a direction M1-M2 shown in FIG. 1 according to some embodiments of the present disclosure.

In some embodiments of the present disclosure, as shown in FIG. 7, the surface of the fourth portion 42 of the first dielectric layer 40 facing the light exit surface of the display panel is a step structure, i.e., a differentiated design is provided for the distance between the surface of the fourth portion 42 of the first dielectric layer 40 facing the light exit surface of the display panel and the light-emitting device 20 along the direction perpendicular to the plane of the display panel. By providing multiple steps on the surface of the fourth portion 42 facing the light exit surface of the display panel, light shapes in different regions of the light exit surface corresponding to the peripheral region of the light-emitting device 20 can be improved flexibly.

In addition, in at least two steps included in the surface of the fourth portion 42 of the first dielectric layer 40 facing the light exit surface of the display panel, a step further away from the third portion 41 has a smaller distance between the surface facing the light exit surface of the display panel and the light-emitting device 20 along the direction perpendicular to the plane of the display panel. For the step further away from the third portion 41, the distance between the surface of the fourth portion 42 facing the light exit surface of the display panel and the surface of the second portion 41 facing the light exit surface of the display panel is larger along the direction perpendicular to the plane of the display panel. Thus, more light emitted by the light-emitting device 20 is gathered to the light exit surface above the region of the light-emitting device 20 through the fourth portion 42 and the second portion 32, thereby effectively improving the light shapes.

Figure 8:
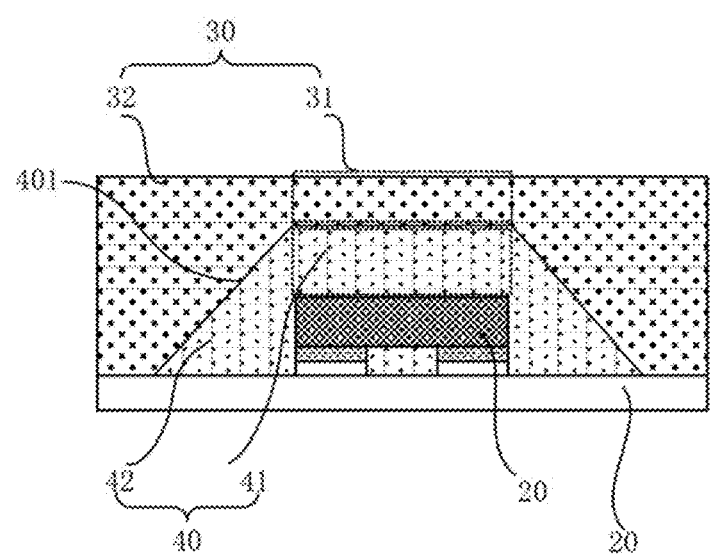
FIG. 8 is a schematic cross-sectional view along a direction M1-M2 shown in FIG. 1 according to some embodiments of the present disclosure.
Figure 9:
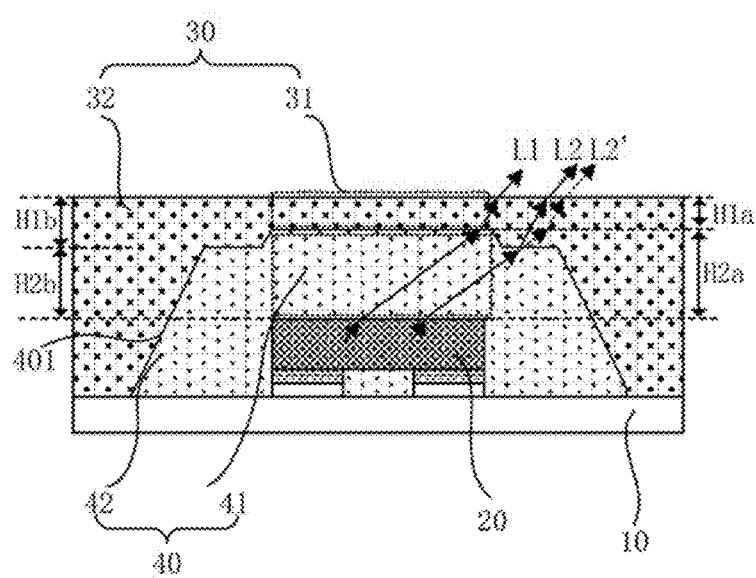
FIG. 9 is a schematic cross-sectional view along a direction M1-M2 shown in FIG. 1 according to some embodiments of the present disclosure.

FIG. 8 is a schematic cross-sectional view along a direction M1-M2 shown in FIG. 1 according to some embodiments of the present disclosure. FIG. 9 is a schematic cross-sectional view along a direction M1-M2 shown in FIG. 1 according to some embodiments of the present disclosure.

In some embodiments of the present disclosure, as shown in FIG. 8, an angle formed between a lateral surface 401 of the first dielectric layer 40 and the substrate 10 is greater than 0° and smaller than 90°, i.e., the lateral surface 401 of the first dielectric layer 40 is an inclined surface. In some embodiments of the present disclosure, in a direction from the light-emitting device 20 to the light exit surface of the display panel, a distance between the lateral surface of the first dielectric layer 40 and the light-emitting device 20 in the direction parallel to the plane of the display panel is increasingly small.

In an implementation corresponding to this embodiment, as shown in FIG. 8, the lateral surface 401 of the first dielectric layer 40 is the surface of the third portion 42 of the first dielectric layer 40 facing the light exit surface of the display panel, i.e., the lateral surface of the first dielectric layer 40 and a portion of the first dielectric layer 40 located at a side of the lateral surface facing the substrate 10 form the third portion 42 of the first dielectric layer 40.

In an implementation corresponding to this embodiment, as shown in FIG. 9, the surface of the first dielectric layer 40 facing the light exit surface of the display panel includes a step structure, and an angle formed between the lateral surface 401 of the first dielectric layer 40 and the substrate 10 is greater than 0° and smaller than 90°.

In some embodiments of the present disclosure, as shown in FIG. 5 and FIG. 6, the surface of the first encapsulation layer 30 facing the light exit surface of the display panel is the step structure. That is, the stepwise differentiated design is provided for the distance between the surface of the first encapsulation layer 30 facing the light exit surface of the display panel and the light-emitting device 20 along the direction perpendicular to the plane of the display panel.

In some embodiments of the present disclosure, as shown in FIG. 5 and FIG. 6, when the distance H1a between the surface of the first portion 31 away from the light-emitting device 20 and the light-emitting device 20 is smaller than the distance H1b between the surface of the second portion 32 away from the light-emitting device 20 and the light-emitting device 20 along the direction perpendicular to the plane of the display panel, the first portion 31 and the second portion 32 of the first encapsulation layer 30 can form the step structure.

Figure 10:
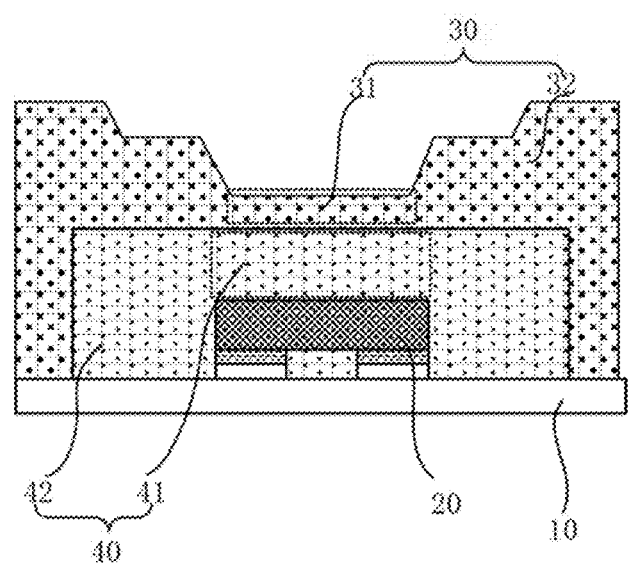
FIG. 10 is a schematic cross-sectional view along a direction M1-M2 shown in FIG. 1 according to some embodiments of the present disclosure.

FIG. 10 is a schematic cross-sectional view along a direction M1-M2 shown in FIG. 1 according to some embodiments of the present disclosure.

In some embodiments of the present disclosure, as shown in FIG. 10, the surface of the second portion 32 of the first encapsulation layer 30 facing the light exit surface of the display panel is a step structure, i.e., a differentiated design is provided for the distance between the surface of the second portion 32 of the first encapsulation layer 30 facing the light exit surface of the display panel and the light-emitting device 20 along the direction perpendicular to the plane of the display panel. By providing multiple steps on the surface of the second portion 32 facing the light exit surface of the display panel, light shapes in different regions of the light exit surface corresponding to the peripheral region of the light-emitting device 20 can be improved flexibly.

In addition, in at least two steps included in the surface of the second portion 32 of the first encapsulation layer 30 facing the light exit surface of the display panel, a step further away from the first portion 31 has a larger distance between the surface facing the light exit surface of the display panel and the light-emitting device 20 along the direction perpendicular to the plane of the display panel. For the step further away from the first portion 31, the distance between the surface of the second portion 32 facing the light exit surface of the display panel and the surface of the fourth portion 42 facing the light exit surface of the display panel is larger along the direction perpendicular to the plane of the display panel. Thus, more light emitted by the light-emitting device 20 is gathered to the light exit surface above the region of the light-emitting device 20 through the fourth portion 42 and the second portion 32, thereby effectively improving the light shape.

Figure 11:
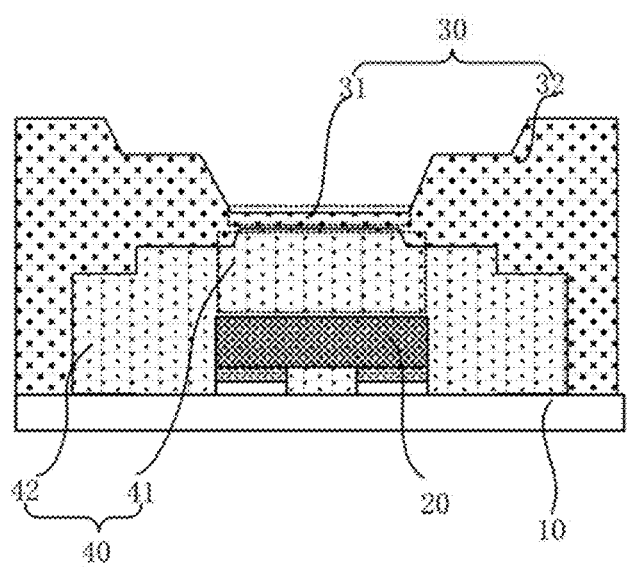
FIG. 11 is a schematic cross-sectional view along a direction M1-M2 shown in FIG. 1 according to some embodiments of the present disclosure.

FIG. 11 is a schematic cross-sectional view along a direction M1-M2 shown in FIG. 1 according to some embodiments of the present disclosure.

In some embodiments of the present disclosure, as shown in FIG. 11, the surface of the second portion 32 of the first encapsulation layer 30 facing the light exit surface of the display panel is a step structure, and the surface of the fourth portion 42 of the first dielectric layer 40 facing the light exit surface of the display panel is a step structure.

In addition, in at least two steps included in the surface of the second portion 32 of the first encapsulation layer 30 facing the light exit surface of the display panel, a step further away from the first portion 31 has a larger distance between the surface facing the light exit surface of the display panel and the light-emitting device 20 along the direction perpendicular to the plane of the display panel. In at least two steps included in the surface of the fourth portion 42 of the first dielectric layer 40 facing the light exit surface of the display panel, if the surface included by a step is further away from the third portion 41, a distance between the surface facing the light exit surface of the display panel and the light-emitting device 20 along the direction perpendicular to the plane of the display panel is smaller.

A number of the steps included in the surface of the second portion 32 facing the light exit surface of the display panel may correspond to a number of the steps included in the surface of the fourth portion 42 facing the light exit surface of the display panel. Along the direction perpendicular to the plane of the display panel, the steps included in the surface of the second portion 32 facing the light exit surface of the display panel overlap with the steps included in the surface of the fourth portion 42 facing the light exit surface of the display panel in one-to-one correspondence.

In some embodiments of the present disclosure, as shown in FIG. 4 to FIG. 11, the surface of the third portion 41 of the first dielectric layer 40 facing the surface of the display panel includes a plane structure.

In some embodiments of the present disclosure, as shown in FIG. 4 to FIG. 11, the surface of the fourth portion 42 of the first dielectric layer 40 facing the surface of the display panel includes a plane structure.

In response to different shapes for the surface of the first dielectric layer 40 facing the light exit surface of the display panel, a brightness at a front viewing angle when the light emitted by the light-emitting device 20 exits from the light exit surface of the display panel is measured. The first dielectric layer 40 has a refractive index of 1.3, and the first encapsulation layer 30 has a refractive index of 1.5. As shown in Table 1, compared with a hemispherical structure for the surface of the first dielectric layer 40 facing the light exit surface of the display panel, the brightness at the front viewing angle when the light emitted by the light-emitting device 20 exits from the light exit surface of the display panel is obviously greater in response to a plane structure for the surface of the first dielectric layer 40 facing the light exit surface of the display panel.

TABLE 1

| Surface morphology of the first dielectric layer | Brightness at the front viewing angle |
|---|---|
| Plane | 1.30 |
| Hemisphere | 1.16 |

When the surface of the first dielectric layer 40 facing the light exit surface of the display panel includes the plane structure, the brightness at the front viewing angle can be improved, and the light exit efficiency of the display panel and the light shapes of the display panel can be improved.

In some embodiments of the present disclosure, as shown in FIG. 5 and FIG. 10, when the surface of the first dielectric layer 40 facing the light exit surface of the display panel 10 is the plane structure, the upper surface of the first dielectric layer 40 facing the light exit surface of the display panel 10 may be parallel to the substrate 10.

In some embodiments of the present disclosure, as shown in FIG. 4, FIG. 6, FIG. 7 and FIG. 11, when the surface of the first dielectric layer 40 facing the light exit surface of the display panel 10 includes the step structure, i.e., when the surface of the first dielectric layer 40 facing the light exit surface of the display panel 10 includes at least two steps, upper surfaces of the at least two steps facing the light exit surface of the display panel are a plane structure.

In some embodiments of the present disclosure, as shown in FIG. 8 and FIG. 9, when the angle formed between the lateral surface 401 of the first dielectric layer 40 and the substrate 10 is greater than 0° and smaller than 90°, i.e., when the lateral surface 401 of the first dielectric layer 40 is the plane structure, the lateral surface 401 is the plane structure.

In some embodiments of the present disclosure, as shown in FIG. 4 to FIG. 11, the surface of the first portion 31 of the first encapsulation layer 30 facing the surface of the display panel includes the plane structure.

In some embodiments of the present disclosure, as shown in FIG. 4 to FIG. 11, the surface of the second portion 32 of the first encapsulation layer 30 facing the surface of the display panel includes the plane structure.

In some embodiments of the present disclosure, as shown in FIG. 4, FIG. 7, FIG. 8 and FIG. 9, when the surface of the first encapsulation layer 30 facing the light exit surface of the display panel 10 is the plane structure, the upper surface of the first encapsulation layer 30 facing the light exit surface of the display panel 10 may be parallel to the substrate 10.

In some embodiments of the present disclosure, as shown in FIG. 5, FIG. 6, FIG. 10 and FIG. 11, when the surface of the first encapsulation layer 30 facing the light exit surface of the display panel 10 includes the step structure, i.e., when the surface of the first encapsulation layer 30 facing the light exit surface of the display panel 10 includes at least two steps, upper surfaces of the at least two steps facing the light exit surface of the display panel are the plane structure.

Figure 12:
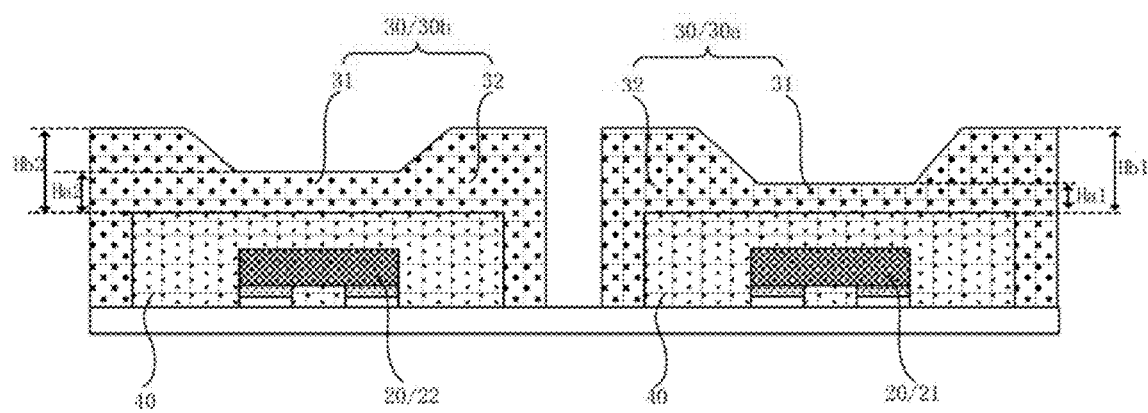
FIG. 12 is a schematic cross-sectional view along a direction N1-N2 shown in FIG. 1 according to some embodiments of the present disclosure.
Figure 13:
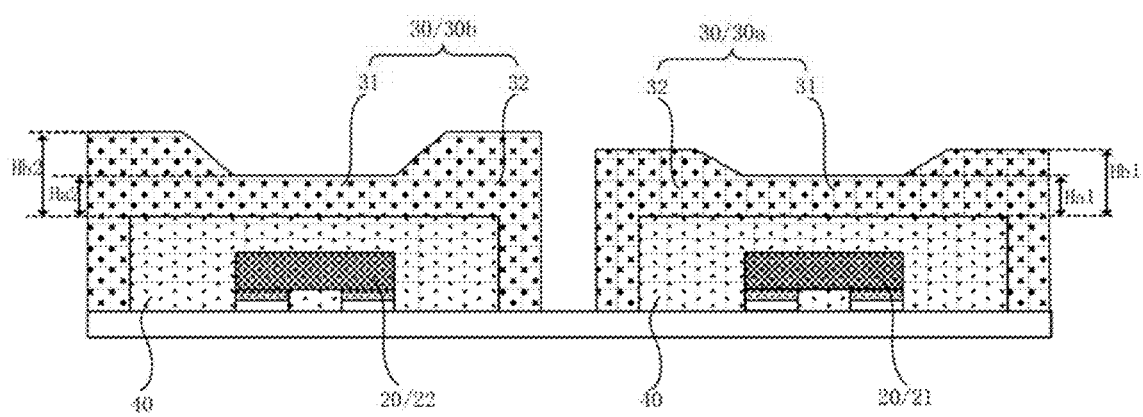
FIG. 13 is a schematic cross-sectional view along a direction N1-N2 shown in FIG. 1 according to some embodiments of the present disclosure.
Figure 14:
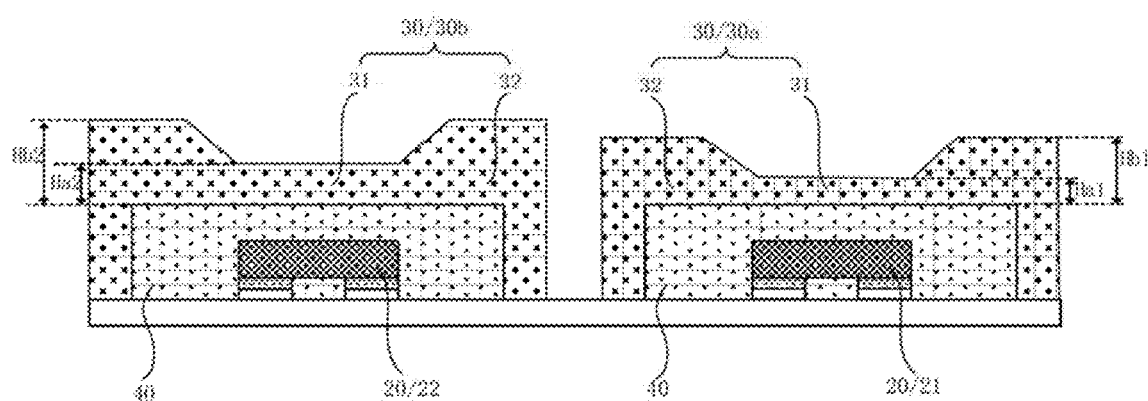
FIG. 14 is a schematic cross-sectional view along a direction N1-N2 shown in FIG. 1 according to some embodiments of the present disclosure.
Figure 15:
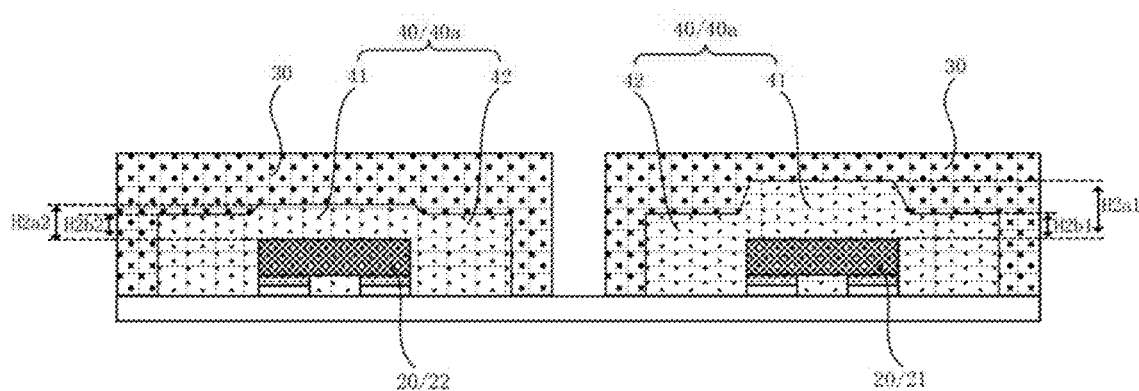
FIG. 15 is a schematic cross-sectional view along a direction N1-N2 shown in FIG. 1 according to some embodiments of the present disclosure.
Figure 16:
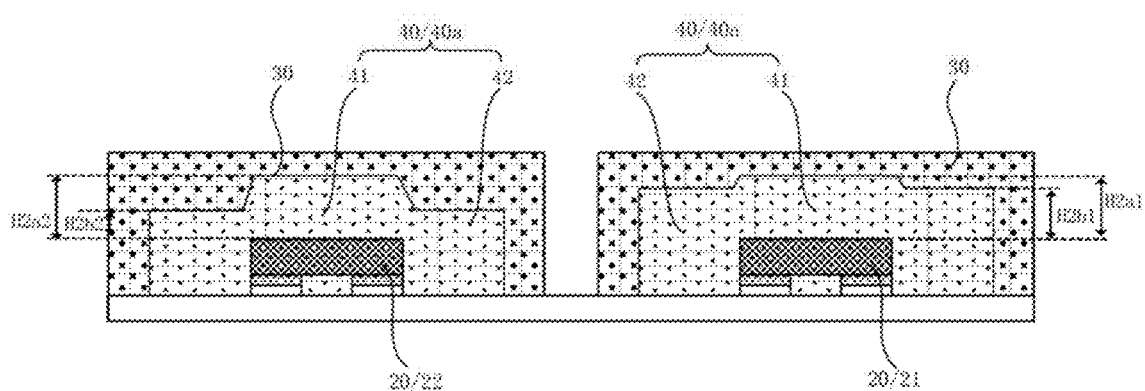
FIG. 16 is a schematic cross-sectional view along a direction N1-N2 shown in FIG. 1 according to some embodiments of the present disclosure.
Figure 17:
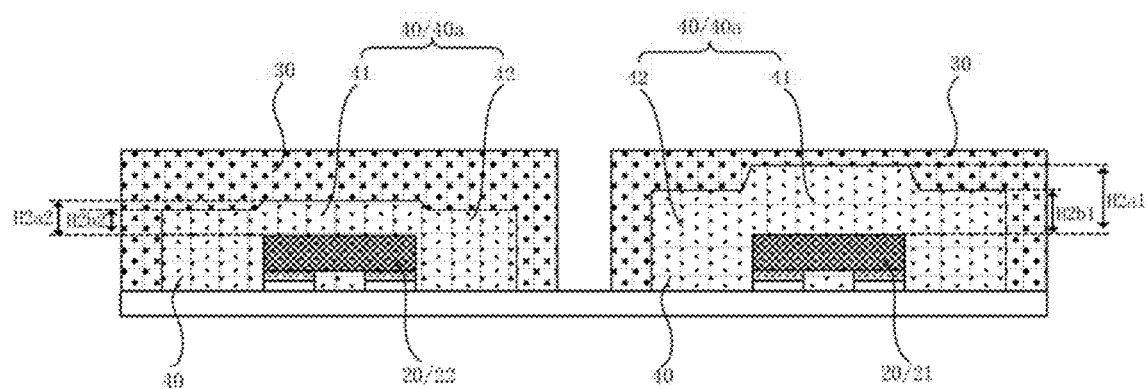
FIG. 17 is a schematic cross-sectional view along a direction N1-N2 shown in FIG. 1 according to some embodiments of the present disclosure.

FIG. 12 is a schematic cross-sectional view along a direction N1-N2 shown in FIG. 1 according to some embodiments of the present disclosure. FIG. 13 is a schematic cross-sectional view along a direction N1-N2 shown in FIG. 1 according to some embodiments of the present disclosure. FIG. 14 is a schematic cross-sectional view along a direction N1-N2 shown in FIG. 1 according to some embodiments of the present disclosure. FIG. 15 is a schematic cross-sectional view along a direction N1-N2 shown in FIG. 1 according to some embodiments of the present disclosure. FIG. 16 is a schematic cross-sectional view along a direction N1-N2 shown in FIG. 1 according to some embodiments of the present disclosure. FIG. 17 is a schematic cross-sectional view along a direction N1-N2 shown in FIG. 1 according to some embodiments of the present disclosure.

In some embodiments of the present disclosure, as shown in FIG. 11 and FIG. 12, the light-emitting devices 20 in the display panel include a first color light-emitting device 21 and a second color light-emitting device 22. The first color light-emitting device 21 can emit first color light, and the second color light-emitting device 22 can emit second color light. The first color light and the second color light have different wavelengths.

In the related art, a brightness attenuation degree under a large viewing angle for light emitted by the first color light-emitting device 21 is greater than a brightness attenuation degree under a large viewing angle for light emitted by the second color light-emitting device 22. While the viewing angle increases, the display panel has visible color deviation. Due to the larger brightness attenuation degree under the large viewing angle for the light emitted by the first color light-emitting device 21, color deviation biased to a color corresponding to the second color light is present on an image of the display panel under the large viewing angle.

In some embodiments of the present disclosure, the first encapsulation layer 30 includes a first encapsulation sub-layer 30a and a second encapsulation sub-layer 30b. The first encapsulation sub-layer 30a and the second encapsulation sub-layer 30b each include the first portion 31 and the second portion 32. Along the direction perpendicular to the plane of the display panel 10, the first portion 31 of the first encapsulation sub-layer 30a at least partially overlaps with the first color light-emitting device 21, and the first portion 31 of the second encapsulation sub-layer 30b at least partially overlaps with the second color light-emitting device 22. It is to be understood that the first encapsulation sub-layer 30a is a portion at least partially overlapping with the light-emitting device 20 in the first encapsulation layer 30, and the second encapsulation sub-layer 30b is a portion at least partially overlapping with the second color light-emitting device 22 in the first encapsulation layer 30.

In some embodiments of the present disclosure, the first dielectric layer 40 includes a first dielectric sub-layer 40a and a second dielectric sub-layer 40b. The first dielectric sub-layer 40a and the second dielectric sub-layer 40b each include the third portion 41 and the fourth portion 42. Along the direction perpendicular to the plane of the display panel 10, the third portion 41 of the first dielectric sub-layer 40a at least partially overlaps with the first color light-emitting device 21, and the fourth portion 42 of the second dielectric sub-layer 40b at least partially overlaps with the second color light-emitting device 22. It is to be understood that the first dielectric sub-layer 40a is a portion at least partially overlapping with the light-emitting device 20 in the first dielectric layer 40, and the first dielectric sub-layer 40a is a portion at least partially overlapping with the second color light-emitting device 22 in the first dielectric layer 40.

In some embodiments of the present disclosure, by providing a differentiated design for the first encapsulation sub-layer 30a and the second encapsulation sub-layer 30b, and/or, by providing a differentiated design for the first dielectric sub-layer 40a and the second dielectric sub-layer 40b, the color deviation of the display panel under the large viewing angle is improved.

In some embodiments of the present disclosure, as shown in FIG. 12, a distance between a surface of the first portion 31 of the first encapsulation sub-layer 30a facing the light exit surface of the display panel and the light-emitting device 20 along the direction perpendicular to the plane of the display panel is defined as Ha1, and a distance between a surface of the first portion 31 of the second encapsulation sub-layer 30b facing the light exit surface of the display panel and the light-emitting device 20 along the direction perpendicular to the plane of the display panel is defined as Ha2, Ha1<Ha2. In case of the smaller distance between the surface of the first portion 31 facing the light exit surface of the display panel and the light-emitting device 20 along the direction perpendicular to the plane of the display panel, there is a higher transmittance when the light emitted by the light-emitting device 20 passes through the first portion 31.

In some embodiments of the present disclosure, compared with the first portion 31 overlapping with the second color light-emitting device 22, the first portion 31 overlapping with the first color light-emitting device 21 is a higher transmittance for the first color light. This can improve the color deviation of the display panel under the large viewing angle.

In some embodiments of the present disclosure, as shown in FIG. 13, a distance between a surface of the second portion 32 of the first encapsulation sub-layer 30a facing the light exit surface of the display panel and the light-emitting device 20 along the direction perpendicular to the plane of the display panel is defined as H1; and a distance between a surface of the second portion 32 of the second encapsulation sub-layer 30b facing the light exit surface of the display panel and the light-emitting device 20 along the direction perpendicular to the plane of the display panel is defined as Hb2, Hb1<Hb2. In case of the smaller distance between the surface of the second portion 32 facing the light exit surface of the display panel and the light-emitting device 20 along the direction perpendicular to the plane of the display panel, the light emitted by the light-emitting device 20 is less gathered by the second portion 32 to the region of the light-emitting device 20, i.e., the light emitted by the light-emitting device 20 is more diverged.

In some embodiments of the present disclosure, compared with the second portion 32 overlapping with the second color light-emitting device 22, the light of the first color light emitted by the second portion 32 overlapping with the first color light-emitting device 21 is more diverged. This can improve the color deviation of the display panel under the large viewing angle.

In some embodiments of the present disclosure, as shown in FIG. 14, Ha1<Ha2 and Hb1<Hb2.

In some embodiments of the present disclosure, as shown in FIG. 15, a distance between a surface of the third portion 41 of the first dielectric sub-layer 40a facing the light exit surface of the display panel and the light-emitting device 20 along the direction perpendicular to the plane of the display panel is defined as H2a1, and a distance between a surface of the third portion 41 of the second dielectric sub-layer 40b facing the light exit surface of the display panel and the light-emitting device 20 along the direction perpendicular to the plane of the display panel is defined as H2a2, where H2a1>H2a2.

In some embodiments of the present disclosure, as shown in FIG. 16, a distance between a surface of the fourth portion 42 of the first dielectric sub-layer 40a facing the light exit surface of the display panel and the light-emitting device 20 along the direction perpendicular to the plane of the display panel is defined as H2b1, and a distance between a surface of the fourth portion 42 of the second dielectric sub-layer 40b facing the light exit surface of the display panel and the light-emitting device 20 along the direction perpendicular to the plane of the display panel is defined as H2b2, H2b1>H2b2. In case of the larger distance between the surface of the third portion 32 facing the light exit surface of the display panel and the light-emitting device 20 along the direction perpendicular to the plane of the display panel, the light emitted by the light-emitting device 20 is less gathered by the fourth portion 42 and the second portion 32 to the region of the light-emitting device 20, i.e., the light emitted by the light-emitting device 20 is more diverged.

In some embodiments of the present disclosure, compared with the fourth portion 42 overlapping with the second color light-emitting device 22, the light of the first color light emitted by the fourth portion 42 overlapping with the first color light-emitting device 21 is more diverged. This can improve the color deviation of the display panel under the large viewing angle.

In some embodiments of the present disclosure, as shown in FIG. 17, H2a1>H2a2 and H2b1>H2b2.

Figure 18:
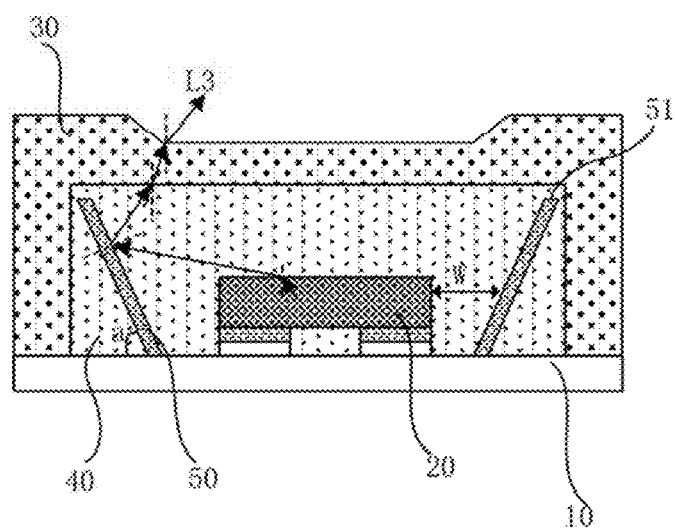
FIG. 18 is a schematic cross-sectional view along a direction M1-M2 shown in FIG. 1 according to some embodiments of the present disclosure.
Figure 19:
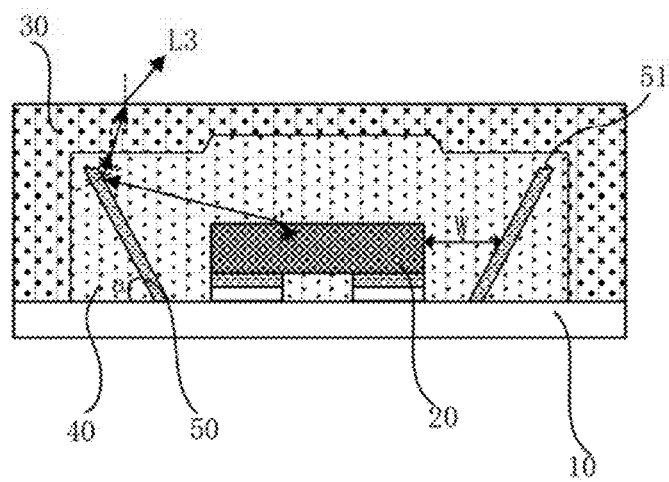
FIG. 19 is a schematic cross-sectional view along a direction M1-M2 shown in FIG. 1 according to some embodiments of the present disclosure.

FIG. 18 is a schematic cross-sectional view along a direction M1-M2 shown in FIG. 1 according to some embodiments of the present disclosure. FIG. 19 is a schematic cross-sectional view along a direction M1-M2 shown in FIG. 1 according to some embodiments of the present disclosure.

In some embodiments of the present disclosure, as shown in FIG. 18 and FIG. 19, the display panel further includes a light reflecting structure 50. The light reflecting structure 50 can reflect light entering its surface. The light reflecting structure 50 is located at a periphery of the light-emitting device 20. Along a direction parallel to the plane of the display panel, a distance between the light reflecting structure 50 and the light-emitting device 20 is W. In a direction from the substrate 01 to the first encapsulation layer 30, a value of the W gradually increases.

In some embodiments of the present disclosure, the light reflecting structure 50 is inclined at the periphery of the light-emitting device 20. Along the direction from the substrate 01 to the first encapsulation layer 30, a distance between the light reflecting structure 50 and the light-emitting device 20 at least partially surrounded by the light reflecting structure gradually increases.

In some embodiments of the present disclosure, light L3 emitted by the light-emitting device 20 and entering a surface of the light reflecting structure 50 facing the light-emitting device 20 is taken as an example for description. As shown in FIG. 18 and FIG. 19, the light-emitting device 20 usually has the large refractive index and the first dielectric layer 40 has the smaller refractive index than the first encapsulation layer 30, an angle of the light L3 entering the first dielectric layer 40 from the light-emitting device 20 increases obviously. With the inclined light reflecting structure 50 at the periphery of the light-emitting device 20, the light reflecting structure 50 can reflect most of the large-angle light L3 to a vicinity of the light exit surface in the region of the light-emitting device 20. Therefore, the light exit shape of the light-emitting device can be improved obviously.

In addition, the light L3 reflected by the light reflecting structure 50 re-enter the first encapsulation layer 30 and exits from the upper surface of the first encapsulation layer 30. Since the light L3 is reflected by the light reflecting structure 50, an angle formed between each light L3 in the first encapsulation layer 30 and a normal direction of the upper surface of the first encapsulation layer 30 is small. Therefore, an amount of totally reflected light when the light enter the air from the first encapsulation layer 30 is reduced, thereby improving the light exit efficiency of the display panel.

In some embodiments of the present disclosure, as shown in FIG. 18 and FIG. 19, the light reflecting structure 50 includes a first end 51. The first end 51 is an end of the light reflecting structure 50 adjacent to the light exit surface of the display panel. A distance between the first end 51 and the substrate 10 is greater than a distance between an end of the light-emitting device 20 away from the substrate 10 and the substrate 10. That is, along the direction perpendicular to the plane of the display panel, the first end of the light reflecting structure 50 is higher than the end of the light-emitting device 20 away from the substrate 10.

According to the technical solution, the large-angle light emitted by the light-emitting device 20 can be reflected by the light reflecting structure 50 as much as possible and exits from the light exit surface corresponding to the region of the light-emitting device 20.

In some embodiments of the present disclosure, as shown in FIG. 18 and FIG. 19, the light reflecting structure 50 is located between the surface of the first dielectric layer 40 facing the light exit surface of the display panel and the substrate 10. It is to be understood that the light reflecting structure 50 is covered by the first dielectric layer 40.

The light reflected by the light reflecting structure 50 can be extracted as much as possible by an extraction structure formed by the first dielectric layer 40 and the first encapsulation layer 30, thereby improving the light exit efficiency of the display panel.

In some embodiments of the present disclosure, as shown in FIG. 18 and FIG. 19, an angle α between the light reflecting structure 50 and the substrate 10 is greater than or equal to 30°, and smaller than or equal to 80°. By providing an angle of inclination of the light reflecting structure 50 between 30° and 80°, the light exit efficiency of the display panel can be effectively improved.

Figure 20:
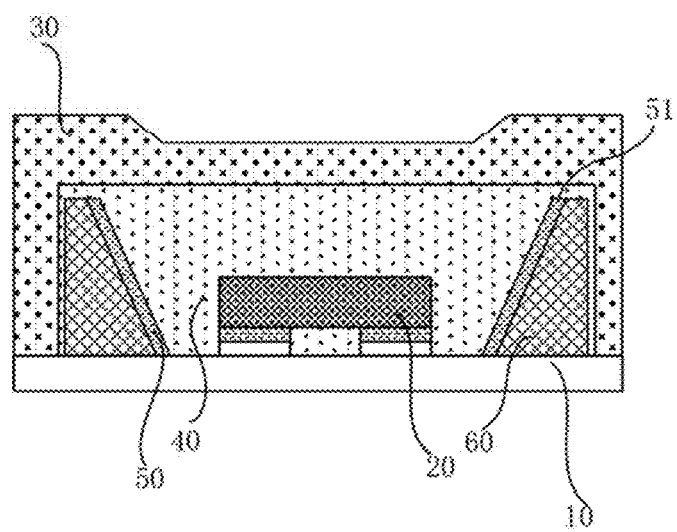
FIG. 20 is a schematic cross-sectional view along a direction M1-M2 shown in FIG. 1 according to some embodiments of the present disclosure.
Figure 21:
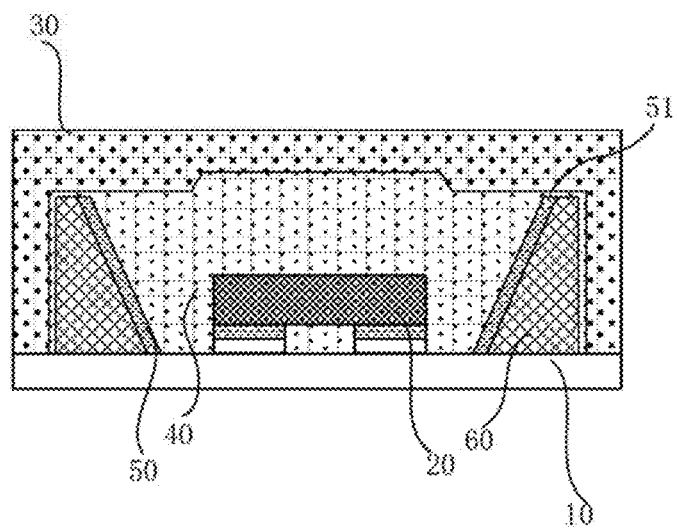
FIG. 21 is a schematic cross-sectional view along a direction M1-M2 shown in FIG. 1 according to some embodiments of the present disclosure.

FIG. 20 is a schematic cross-sectional view along a direction M1-M2 shown in FIG. 1 according to some embodiments of the present disclosure. FIG. 21 is a schematic cross-sectional view along a direction M1-M2 shown in FIG. 1 according to some embodiments of the present disclosure.

In some embodiments of the present disclosure, as shown in FIG. 20 and FIG. 21, the display panel further includes a retaining wall structure 60. The retaining wall structure 60 is provided at a periphery of the light-emitting device 20. At least a part of the light reflecting structure 50 is provided on a surface of the retaining wall structure 60 facing the light-emitting device 20. By providing the light reflecting structure 50 on the retaining wall structure 60, the light reflecting structure 50 is inclined stably and manufactured easily.

As shown in FIG. 20 and FIG. 21, an inner sidewall of the retaining wall structure 60 facing the light-emitting device 20 may be an inclined sidewall. The light reflecting structure 50 may be freely attached to the inner sidewall of the retaining wall structure 60 facing the light-emitting device 20. Therefore, the light reflecting structure 50 is manufactured easily. For example, the retaining wall structure 60 is formed by deposition and etching. The light reflecting structure 50 is then freely attached by the deposition to the inner sidewall of the retaining wall structure 60 facing the light-emitting device 20.

In addition, when the angle formed between the light reflecting structure 50 and the substrate 10 is greater than or equal to 30°, and smaller than or equal to 80°, an angle formed between the inner sidewall of the retaining wall structure 60 and the substrate 10 may also be greater than or equal to 30°, and smaller than or equal to 80°.

As shown in FIG. 20 and FIG. 21, when a distance between the first end 51 of the light reflecting structure 50 and the substrate 10 is greater than the distance between the end of the light-emitting device 20 away from the substrate 10 and the substrate 10, a distance between an end of the retaining wall structure 60 away from the substrate 10 and the substrate 10 may also be greater than the distance between the end of the light-emitting device 20 away from the substrate 10 and the substrate 10.

As shown in FIG. 20 and FIG. 21, when the light reflecting structure 50 is located between the surface of the first dielectric layer 40 facing the light exit surface of the display panel and the substrate 10, the retaining wall structure 60 may also be located between the surface of the first dielectric layer 40 facing the light exit surface of the display panel and the substrate 10.

Figure 22:
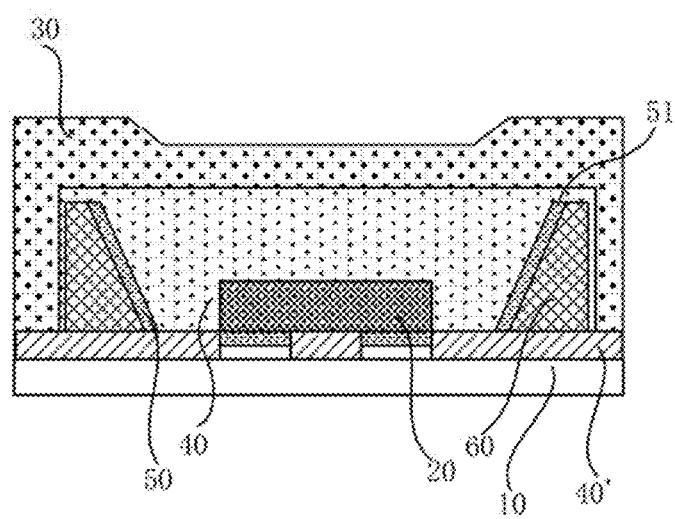
FIG. 22 is a schematic cross-sectional view along a direction M1-M2 shown in FIG. 1 according to some embodiments of the present disclosure.
Figure 23:
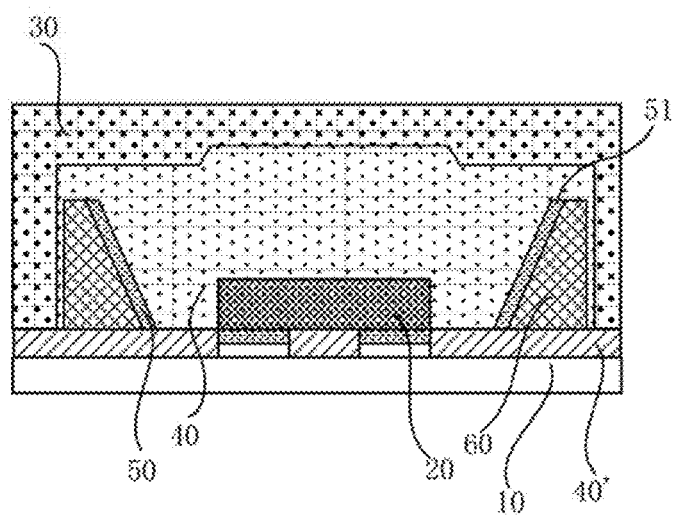
FIG. 23 is a schematic cross-sectional view along a direction M1-M2 shown in FIG. 1 according to some embodiments of the present disclosure.

FIG. 22 is a schematic cross-sectional view along a direction M1-M2 shown in FIG. 1 according to some embodiments of the present disclosure. FIG. 23 is a schematic cross-sectional view along a direction M1-M2 shown in FIG. 1 according to some embodiments of the present disclosure.

In some embodiments of the present disclosure, as shown in FIG. 22 and FIG. 23, the display panel further includes a second dielectric layer 40'. The retaining wall structure 60 is provided at a side of the second dielectric layer 40' away from the substrate 10. The second dielectric layer 40' may serve as a bearing surface of the retaining wall structure 60, and is easy to implement the effect that the distance between the end of the retaining wall structure 60 away from the substrate 10 and the substrate 10 is greater than the distance between the end of the light-emitting device 20 away from the substrate 10 and the substrate 10.

In some embodiments of the present disclosure, as shown in FIG. 22 and FIG. 23, the display panel further includes a second dielectric layer 40'. A refractive index of the second dielectric layer 40' is smaller than the refractive index of the first encapsulation layer 30. The second dielectric layer 40' and the first dielectric layer 40 may be an integrated structure. The second dielectric layer 40' and the first dielectric layer 40 may also be layers having different refractive indexes. Since the refractive index of the second dielectric layer 40' is smaller than the refractive index of the first encapsulation layer 30, the second dielectric layer 40' can also be cooperated with the first encapsulation layer 30 like the first dielectric layer 40 to improve the light exit efficiency and light exit shape of the display panel.

In some embodiments of the present disclosure, the retaining wall structure 60 is provided at a side of the second dielectric layer 40' away from the substrate 10, and the refractive index of the second dielectric layer 40' is smaller than the refractive index of the first encapsulation layer 30.

Figure 24:
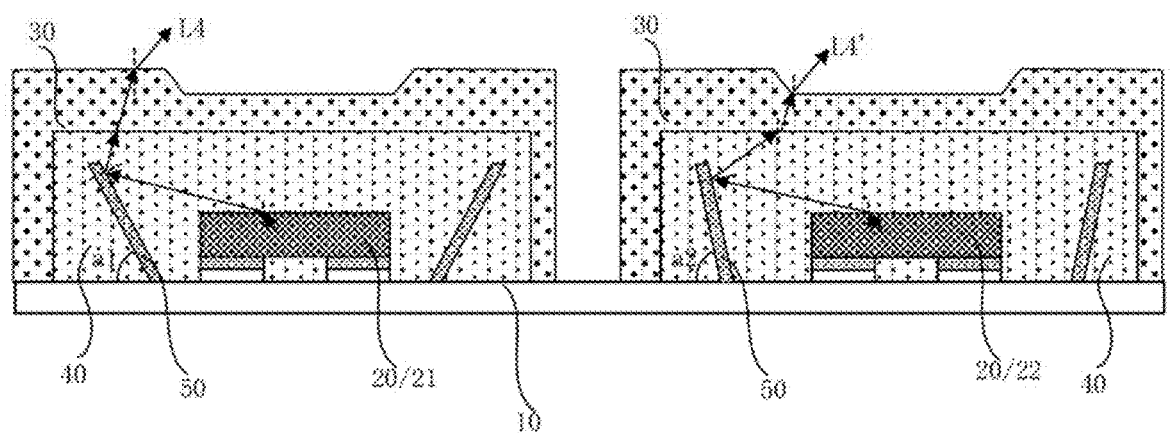
FIG. 24 is a schematic cross-sectional view along a direction N1-N2 shown in FIG. 1 according to some embodiments of the present disclosure.
Figure 25:
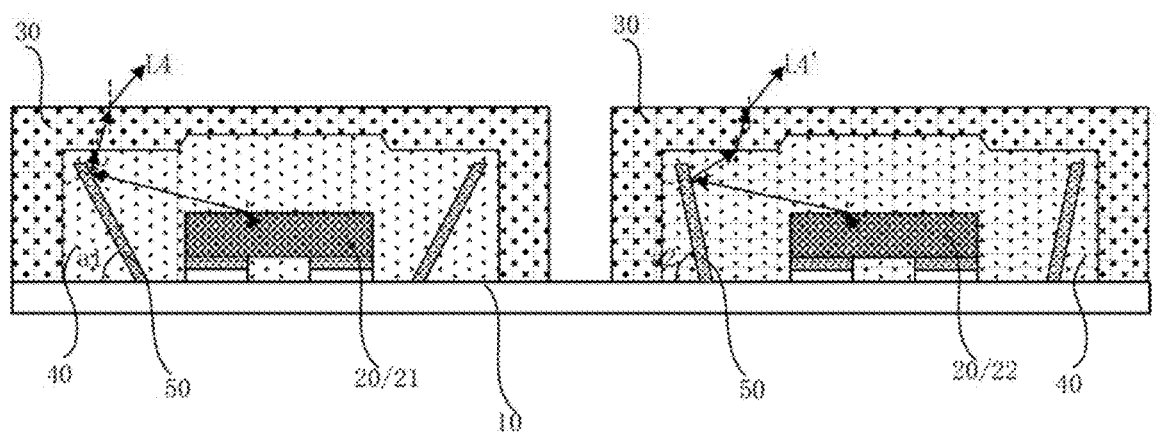
FIG. 25 is a schematic cross-sectional view along a direction N1-N2 shown in FIG. 1 according to some embodiments of the present disclosure.

FIG. 24 is a schematic cross-sectional view along a direction N1-N2 shown in FIG. 1 according to some embodiments of the present disclosure. FIG. 25 is a schematic cross-sectional view along a direction N1-N2 shown in FIG. 1 according to some embodiments of the present disclosure.

In a technical solution corresponding to this embodiment of the present disclosure, as shown in FIG. 24 and FIG. 25, the light-emitting devices 20 in the display panel include the first color light-emitting device 21 and the second color light-emitting device 22. As shown in FIG. 24 and FIG. 25, an angle α1 between the light reflecting structure 50 at the periphery of the first color light-emitting device 21 and the substrate 10 is smaller than an angle α2 between the light reflecting structure 50 at the periphery of the second color light-emitting device 22 and the substrate 10.

In case of a larger angle of inclination of the light reflecting structure 50 toward the direction away from the light-emitting device 20, the brightness at edges of light spots formed by allowing the light emitted by the light-emitting device 21 to exits from one side of the light exit surface of the display panel is improved. With the α1 smaller than the α2, the light reflecting structure 50 at the periphery of the first color light-emitting device 21 has a larger angle of inclination toward the direction away from the light-emitting device 20 over the light reflecting structure 50 at the periphery of the second color light-emitting device 22. Therefore, the brightness at edges of light spots formed by allowing light L4 emitted by the first color light-emitting device 21 to exits from one side of the light exit surface of the display panel is improved more than the brightness at edges of light spots formed by allowing light L4' emitted by the second color light-emitting device 22 to exits from one side of the light exit surface of the display panel. The problem of the color deviation of the second color light under the large viewing angle of the display panel can be relieved.

The first color light-emitting device 21 is a red light-emitting device or a green light-emitting device; and the second color light-emitting device 22 is a blue light-emitting device.

Figure 26:
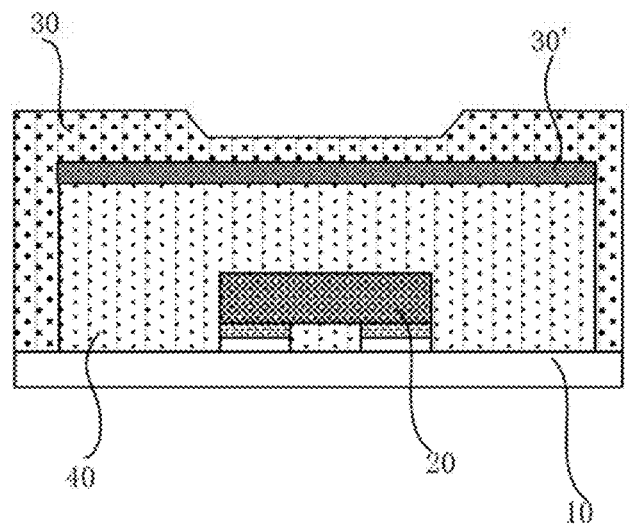
FIG. 26 is a schematic cross-sectional view along a direction M1-M2 shown in FIG. 1 according to some embodiments of the present disclosure.
Figure 27:
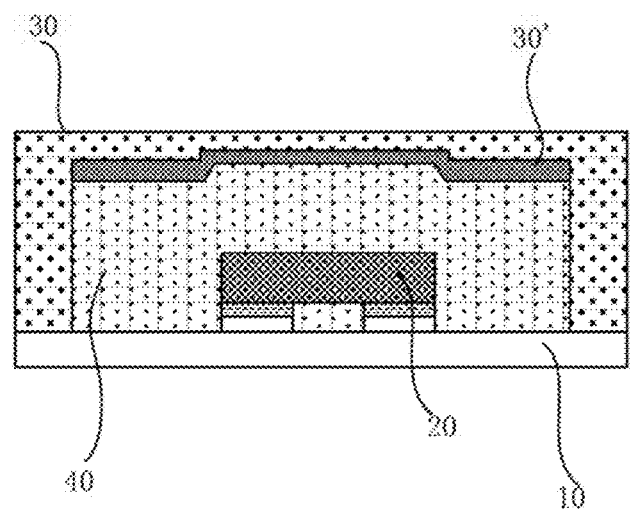
FIG. 27 is a schematic cross-sectional view along a direction M1-M2 shown in FIG. 1 according to some embodiments of the present disclosure.

FIG. 26 is a schematic cross-sectional view along a direction M1-M2 shown in FIG. 1 according to some embodiments of the present disclosure. FIG. 27 is a schematic cross-sectional view along a direction M1-M2 shown in FIG. 1 according to some embodiments of the present disclosure.

In some embodiments of the present disclosure, as shown in FIG. 26 and FIG. 27, the display panel further includes a second encapsulation layer 30'. The second encapsulation layer 30' is located between the first encapsulation layer 30 and the first dielectric layer 40. A refractive index of the second encapsulation layer 30' is smaller than the refractive index of the first encapsulation layer 30 and greater than the refractive index of the first dielectric layer 40. The layer with a gradually changing refractive index between the light-emitting device 20 and the light exit surface of the display panel facilitates extraction of the light emitted by the light-emitting device 20, thereby improving the light exit efficiency of the display panel.

Along the direction perpendicular to the plane of the display panel, the second encapsulation layer 30' at least partially overlaps with the light-emitting device 20.

Figure 28:
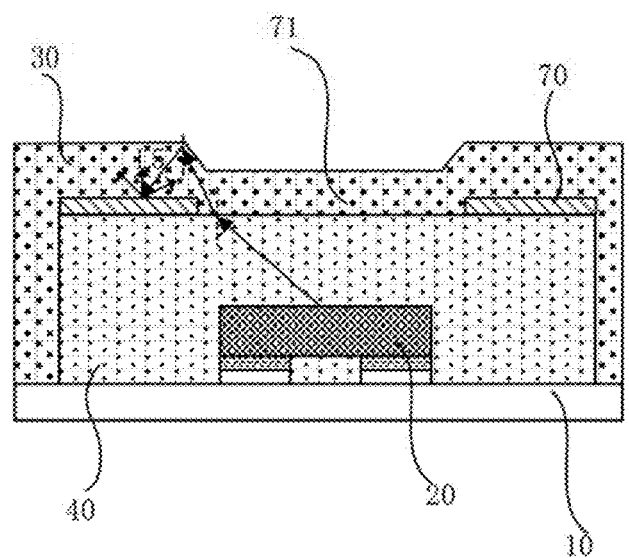
FIG. 28 is a schematic cross-sectional view along a direction M1-M2 shown in FIG. 1 according to some embodiments of the present disclosure.
Figure 29:
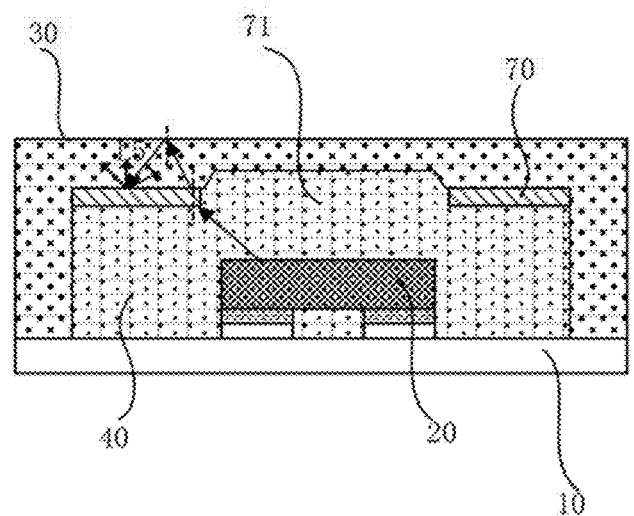
FIG. 29 is a schematic cross-sectional view along a direction M1-M2 shown in FIG. 1 according to some embodiments of the present disclosure.

FIG. 28 is a schematic cross-sectional view along a direction M1-M2 shown in FIG. 1 according to some embodiments of the present disclosure. FIG. 29 is a schematic cross-sectional view along a direction M1-M2 shown in FIG. 1 according to some embodiments of the present disclosure.

In some embodiments of the present disclosure, as shown in FIG. 28 and FIG. 29, the display panel further includes a light scattering layer 70. The light scattering layer 70 is located between the first encapsulation layer 30 and the first dielectric layer 40. The light scattering layer 70 includes a first hollow-out portion 71.

Along the direction perpendicular to the plane of the display panel, the first hollow-out portion 71 at least partially overlaps with the light-emitting device 20, i.e., at least a part of the region of the light-emitting device 20 is not provided with the light scattering film.

In an implementation, along the direction perpendicular to the plane of the display panel, the first hollow-out portion 71 covers the light-emitting device 20, i.e., the light scattering film is not provided in the region of the light-emitting device 20 at all.

When light exits to the outside from the first encapsulation layer 30, at least one of light L5 is totally reflected. The light scattering layer 70 scatters an angle of the totally reflected light L5. The light with the scattered spreading angle re-enters the first encapsulation layer 30 and may exits to the outside from the first encapsulation layer 30. This improves the light exit efficiency of the display panel.

Figure 30:
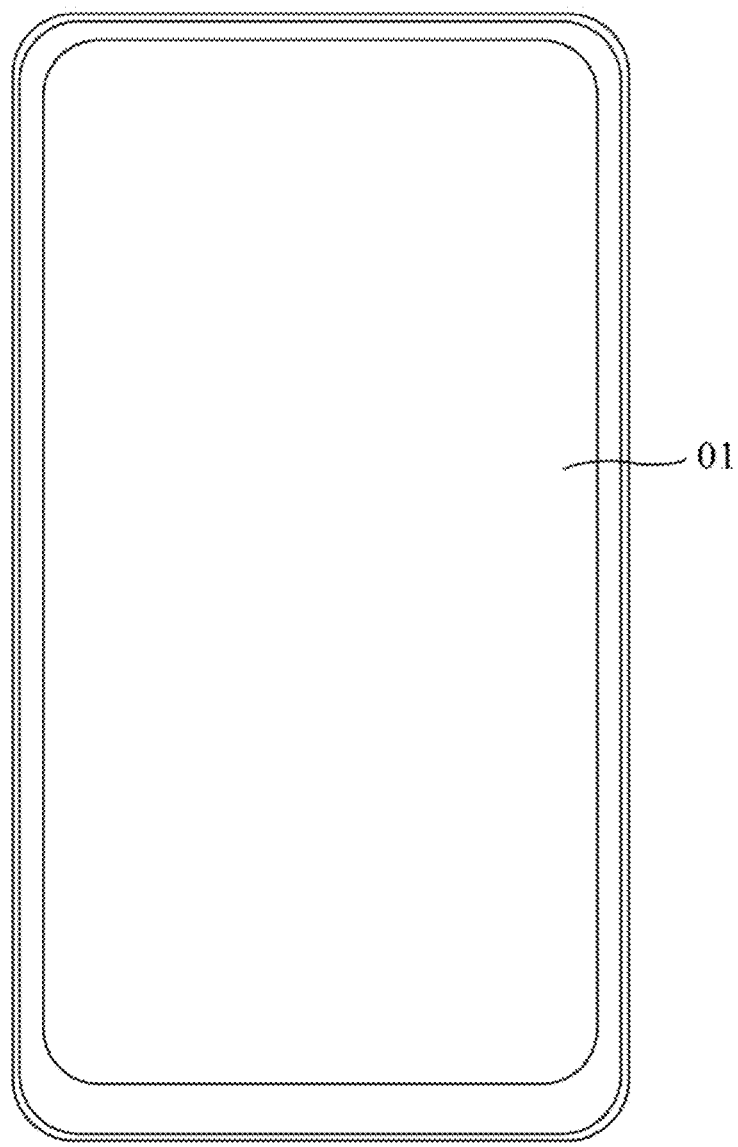
FIG. 30 is a schematic view of a display apparatus according to some embodiments of the present disclosure.

FIG. 30 is a schematic view of a display apparatus according to some embodiments of the present disclosure.

As shown in FIG. 30, a display apparatus is provided in some embodiments of the present disclosure, including the display panel 01 according to any one of the foregoing embodiments. The display apparatus provided by the embodiments of the present disclosure may be an electronic device such as a mobile phone, a computer, a television, an intelligent wearable device (for example, a smart watch), and an in-vehicle display device. This is not limited in the embodiments of the present disclosure.

The display apparatus using the inventive concept of the present disclosure has a high light exit efficiency and a uniform light shape.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. A display panel, comprising:
 a substrate;
 a plurality of light-emitting devices located on the substrate;
 a first encapsulation layer located at a side of the plurality of light-emitting devices facing a light exit surface of the display panel, wherein the first encapsulation layer comprises a first portion and a second portion at least partially surrounding the first portion; and along a direction perpendicular to a plane of the display panel, the first portion at least partially overlaps with at least one light-emitting device of the plurality of light emitting devices; and a first dielectric layer located between the first encapsulation layer and one of the plurality of light-emitting devices, wherein the first dielectric layer comprises a third portion and a fourth portion; the fourth portion at least partially surrounds the third portion; and along the direction perpendicular to the plane of the display panel, the third portion at least partially overlaps with the at least one light-emitting device, wherein a refractive index of the first dielectric layer is smaller than a refractive index of the first encapsulation layer; and along the direction perpendicular to the plane of the display panel, a distance between a surface of the first portion away from the at least one light-emitting device and a surface of the third portion away from the at least one light-emitting device is defined as H1a, and a distance between a surface of the second portion away from the light-emitting device and a surface of the fourth portion away from the at least one light-emitting device is defined as H1b, wherein H1a<H1b.

2. The display panel according to claim 1, wherein along the direction perpendicular to the plane of the display panel, a distance between the surface of the third portion away from the light-emitting device and the at least one light-emitting device is defined as H2a, and a distance between the surface of the fourth portion away from the light-emitting device and the light-emitting device is defined as H2b, wherein H2a>H2b.

3. The display panel according to claim 2, wherein a surface of the third portion facing the light exit surface of the display panel comprises a plane structure, and/or, a surface of the fourth portion facing the light exit surface of the display panel comprises a plane structure.

4. The display panel according to claim 2, wherein a surface of the first dielectric layer facing the light exit surface of the display panel is a step structure.

5. The display panel according to claim 2, wherein an angle formed between a lateral surface of the first dielectric layer and the substrate is greater than 0° and smaller than 90°.

6. The display panel according to claim 1, wherein along the direction perpendicular to the plane of the display panel, a distance between the surface of the first portion away from the at least one light-emitting device and the at least one light-emitting device is defined as Ha, and a distance between the surface of the second portion away from the at least one light-emitting device and the at least one light-emitting device is defined as Hb, wherein Ha<Hb.

7. The display panel according to claim 6, wherein a surface of the first encapsulation layer facing the light exit surface of the display panel comprises a step structure.

8. The display panel according to claim 1, wherein the plurality of light-emitting devices comprise a first color light-emitting device and a second color light-emitting device; and a brightness attenuation degree at a large viewing angle for the first color light-emitting device is greater than a brightness attenuation degree at a large viewing angle for the second color light-emitting device;

the first dielectric layer comprises a first dielectric sub-layer and a second dielectric sub-layer; and along the direction perpendicular to the plane of the display panel, the third portion of the first dielectric sub-layer at least partially overlaps with the first color light-emitting device, and the third portion of the second dielectric sub-layer at least partially overlaps with the second color light-emitting device;

a distance between a surface of the third portion of the first dielectric sub-layer facing the light exit surface of the display panel and the light-emitting device along the direction perpendicular to the plane of the display panel is defined as H2a1; and a distance between a surface of the third portion of the second dielectric sub-layer facing the light exit surface of the display panel and the light-emitting device along the direction perpendicular to the plane of the display panel is defined as H2a2, H2a1>H2a2; and/or a distance between a surface of the fourth portion of the first dielectric sub-layer facing the light exit surface of the display panel and the at least one light-emitting device along the direction perpendicular to the plane of the display panel is defined as H2b1; and a distance between a surface of the fourth portion of the second dielectric sub-layer facing the light exit surface of the display panel and the at least one light-emitting device along the direction perpendicular to the plane of the display panel is defined as H2b2, H2b1>H2b2.

9. The display panel according to claim 8, wherein the first color light-emitting device is a red light-emitting device or a green light-emitting device; and the second color light-emitting device is a blue light-emitting device.

10. The display panel according to claim 1, wherein the plurality of light-emitting devices comprise a first color light-emitting device and a second color light-emitting device; and a brightness attenuation degree at a large viewing angle for the first color light-emitting device is greater than a brightness attenuation degree at a large viewing angle for the second color light-emitting device;

the first encapsulation layer comprises a first encapsulation sub-layer and a second encapsulation sub-layer; and along the direction perpendicular to the plane of the display panel, the first portion of the first encapsulation sub-layer at least partially overlaps with the first color light-emitting device, and the first portion of the second encapsulation sub-layer at least partially overlaps with the second color light-emitting device;

a distance between a surface of the first portion of the first encapsulation sub-layer facing the light exit surface of the display panel and the at least one light-emitting device along the direction perpendicular to the plane of the display panel is defined as Ha1; and a distance between a surface of the first portion of the second encapsulation sub-layer facing the light exit surface of the display panel and the at least one light-emitting device along the direction perpendicular to the plane of the display panel is defined as Ha2, Ha1<Ha2; and/or a distance between a surface of the second portion of the first encapsulation sub-layer facing the light exit surface of the display panel and the at least one light-emitting device along the direction perpendicular to the plane of the display panel is defined as Hb1; and a distance between a surface of the second portion of the second encapsulation sub-layer facing the light exit surface of the display panel and the at least one light-emitting device along the direction perpendicular to the plane of the display panel is defined as Hb2, Hb1<Hb2.

11. The display panel according to claim 1, further comprising a light reflecting structure, wherein the light reflecting structure is located at a periphery of the at least one light-emitting device; and along the direction parallel to the plane of the display panel, a distance between the light reflecting structure and the at least one light-emitting device is defined as W; and in a direction from the substrate to the first encapsulation layer, a value of the W gradually increases.

12. The display panel according to claim 11, wherein an angle formed between the light reflecting structure and the substrate is greater than or equal to 30°, and smaller than or equal to 80°.

13. The display panel according to claim 12, wherein the plurality of light-emitting devices comprise a first color light-emitting device and a second color light-emitting device; and a brightness attenuation degree at a large viewing angle for the first color light-emitting device is greater than a brightness attenuation degree at a large viewing angle for the second color light-emitting device; and an angle formed between the light reflecting structure at a periphery of the first color light-emitting device and the substrate is smaller than an angle formed between the light reflecting structure at a periphery of the second color light-emitting device and the substrate.

14. The display panel according to claim 11, wherein the light reflecting structure comprises a first end; and the first end is an end of the light reflecting structure adjacent to the light exit surface of the display panel; and a distance between the first end and the substrate is greater than a distance between an end of the at least one light-emitting device away from the substrate and the substrate.

15. The display panel according to claim 11, wherein the light reflecting structure is located between a surface of the first dielectric layer facing the light exit surface of the display panel and the substrate.

16. The display panel according to claim 11, further comprising a retaining wall structure, wherein at least part of the light reflecting structure is provided on a surface of the retaining wall structure facing the at least one light-emitting device.

17. The display panel according to claim 16, further comprising a second dielectric layer, wherein a refractive index of the second dielectric layer is smaller than the refractive index of the first encapsulation layer; and the retaining wall structure is provided at a side of the second dielectric layer away from the substrate.

18. The display panel according to claim 1, further comprising a second encapsulation layer, wherein the second encapsulation layer is located between the first encapsulation layer and the first dielectric layer; and a refractive index of the second encapsulation layer is smaller than the refractive index of the first encapsulation layer and greater than the refractive index of the first dielectric layer; and along the direction perpendicular to the plane of the display panel, the second encapsulation layer at least partially overlaps with the at least one light-emitting device.

19. The display panel according to claim 1, further comprising a light scattering layer, wherein the light scattering layer is located between the first encapsulation layer and the first dielectric layer; and the light scattering layer comprises a first hollow-out portion; and along the direction perpendicular to the plane of the display panel, the first hollow-out portion at least partially overlaps with the at least one light-emitting device.

20. A display apparatus, comprising:

a display panel comprising:

a substrate;

a plurality of light-emitting devices located on the substrate;

a first encapsulation layer located at a side of the plurality of light-emitting devices facing a light exit surface of the display panel, wherein the first encapsulation layer comprises a first portion and a second portion; the second portion at least partially surrounds the first portion; and along a direction perpendicular to a plane of the display panel, the first portion at least partially overlaps with at least one light emitting device of the plurality of light-emitting devices; and a first dielectric layer located between the first encapsulation layer and the at least one light-emitting device, wherein the first dielectric layer comprises a third portion and a fourth portion; the fourth portion at least partially surrounds the third portion; and along the direction perpendicular to the plane of the display panel, the third portion at least partially overlaps with the at least one light-emitting device, wherein a refractive index of the first dielectric layer is smaller than a refractive index of the first encapsulation layer; and along the direction perpendicular to the plane of the display panel, a distance between a surface of the first portion away from the at least one light-emitting device and a surface of the third portion away from the at least one light-emitting device is defined as H1a, and a distance between a surface of the second portion away from the at least one light-emitting device and a surface of the fourth portion away from the at least one light-emitting device is defined as H1b, wherein H1a<H1.

* * * * *